United States Patent [19]
Roy

[11] Patent Number: 6,065,092
[45] Date of Patent: *May 16, 2000

[54] INDEPENDENT AND COOPERATIVE MULTICHANNEL MEMORY ARCHITECTURE FOR USE WITH MASTER DEVICE

[75] Inventor: Richard Stephen Roy, Danville, Calif.

[73] Assignee: Hitachi Micro Systems, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/959,280

[22] Filed: Oct. 24, 1997

Related U.S. Application Data

[63] Continuation of application No. 08/438,638, May 10, 1995, abandoned, which is a continuation-in-part of application No. 08/346,694, Nov. 30, 1994, abandoned.

[51] Int. Cl.[7] .............................. G06F 12/00; G06F 13/16
[52] U.S. Cl. ............................... 711/5; 711/168; 711/149; 711/150; 711/167
[58] Field of Search ................................ 711/5, 131, 119, 711/168, 169, 149, 150, 105, 128, 167; 710/126

[56] References Cited

U.S. PATENT DOCUMENTS

| | | | |
|---|---|---|---|
| 4,161,040 | 7/1979 | Satoh | 365/203 |
| 4,272,832 | 6/1981 | Ito | 365/230.08 |
| 4,290,120 | 9/1981 | Stein | 365/205 |
| 4,361,869 | 11/1982 | Johnson et al. | 711/218 |
| 4,417,302 | 11/1983 | Chimienti et al. | 710/264 |
| 4,665,483 | 5/1987 | Ciacci et al. | 710/114 |
| 4,697,112 | 9/1987 | Ohtani et al. | 327/53 |
| 4,833,648 | 5/1989 | Scharrer et al. | 365/189.05 |
| 4,843,264 | 6/1989 | Galbraith | 327/55 |
| 4,935,868 | 6/1990 | DuLac | 710/126 |
| 5,036,231 | 7/1991 | Kanbara | 327/55 |
| 5,081,575 | 1/1992 | Hiller et al. | 710/132 |
| 5,099,452 | 3/1992 | Yamakoshi et al. | 365/190 |
| 5,218,690 | 6/1993 | Boioli et al. | 710/128 |
| 5,243,703 | 9/1993 | Farmwald et al. | 713/400 |
| 5,254,883 | 10/1993 | Horowitz et al. | 326/30 |
| 5,261,064 | 11/1993 | Wyland | 711/211 |
| 5,268,639 | 12/1993 | Gasbarro et al. | 714/736 |
| 5,282,174 | 1/1994 | Little | 365/230.05 |
| 5,299,156 | 3/1994 | Jiang et al. | 365/154 |
| 5,319,755 | 6/1994 | Farmwald et al. | 710/104 |

(List continued on next page.)

FOREIGN PATENT DOCUMENTS 62-180582  8/1987  Japan.

OTHER PUBLICATIONS

New Product Review: ICs BIT Rifles 8nSec Multiported Memories Semiconductor Industry & Business Survey, HTE Research, Inc., V. 11, No. 16, Nov. 13, 1989.

VTI Enters Special Memory Market, Electronic Engineering Times, p. 34, Aug. 12, 1985.

*Primary Examiner*—Reginald G. Bragdon
*Attorney, Agent, or Firm*—Graham & James LLP

[57] ABSTRACT

An independent and cooperative memory architecture is provided which includes a plurality of multi-line channels each capable of carrying either data or address information to a plurality of independent memory clusters. The channels can either operate independently to access and store data in separate ones of the memory clusters, or cooperatively to access and store data in one of the memory clusters. The independent and cooperative operation enables faster and more efficient utilization within a memory device over any prior art memory architecture. Each of the clusters have one or more independently addressable memory banks respectively having a plurality of data storage locations organized into respective arrays with each of the storage locations having a distinct column and row address. The multi-line channels provide a plurality of distinct operating modes for conducting selected data read and/or write transactions within the clusters.

31 Claims, 20 Drawing Sheets

U.S. PATENT DOCUMENTS

| | | | |
|---|---|---|---|
| 5,325,053 | 6/1994 | Gasbarro et al. | 324/158.1 |
| 5,337,285 | 8/1994 | Ware et al. | 365/227 |
| 5,355,391 | 10/1994 | Horowitz et al. | 375/257 |
| 5,357,195 | 10/1994 | Gasbarro et al. | 324/158.1 |
| 5,388,237 | 2/1995 | Sodos | 710/22 |
| 5,390,308 | 2/1995 | Ware et al. | 711/5 |
| 5,408,129 | 4/1995 | Farmwald et al. | 257/692 |
| 5,422,529 | 6/1995 | Lee | 327/536 |
| 5,432,823 | 7/1995 | Gasbarro et al. | 375/356 |
| 5,434,818 | 7/1995 | Byers et al. | 365/189.04 |
| 5,440,523 | 8/1995 | Joffe | 365/230.05 |
| 5,452,436 | 9/1995 | Arai et al. | 709/400 |
| 5,454,082 | 9/1995 | Walrath et al. | 710/108 |
| 5,473,575 | 12/1995 | Farmwald et al. | 365/230.06 |
| 5,481,496 | 1/1996 | Kobayashi et al. | 365/189.05 |
| 5,485,490 | 1/1996 | Leung et al. | 375/371 |
| 5,499,385 | 3/1996 | Farmwald et al. | 710/3 |
| 5,513,327 | 4/1996 | Farmwald et al. | 710/129 |
| 5,542,067 | 7/1996 | Chappell et al. | 711/167 |
| 5,630,163 | 5/1997 | Fung et al. | 711/127 |

| CYCLE # | CLKOUT | CHANNEL [0:7] | | | | | | | |
|---|---|---|---|---|---|---|---|---|---|
| 1 | PIPELINE | CLUSTER | CLUSTER | CLUSTER | BANK | BANK | REFRESH | DIRECT ACCESS | HIT/MISS |
| 2 | ROW | ROW | ROW | ROW | ROW | ROW | ROW | ROW | ROW |
| 3 | COUNT SEQUENCE | COLUMN | COLUMN | COLUMN | COLUMN | COLUMN | COLUMN | COLUMN | R/W |
| 4 | HIGH/LOW | | BURST LENGTH | BURST LENGTH | BURST LENGTH | BURST LENGTH | DATA_CHANNEL | DATA_CHANNEL | PRECHARGE |

ROW BURST ACCESS TRANSACTION HEADER

| CYCLE # | CLKOUT | CHANNEL [0:7] | | | | | | |
|---|---|---|---|---|---|---|---|---|
| 1 | PIPELINE | CLUSTER | CLUSTER | CLUSTER | BANK | REFRESH | DIRECT_ACCESS | HIT/MISS |
| 2 | ROW | ROW | ROW | ROW | ROW | ROW | ROW | ROW |

BACKGROUND ROW CHANGE HEADER

FIG. 10

| CYCLE # | CLKOUT | CHANNEL [0:7] | | | | | | |
|---|---|---|---|---|---|---|---|---|
| 1 | PIPELINE | CLUSTER | CLUSTER | CLUSTER | BANK | REFRESH | DIRECT_ACCESS | HIT/MISS |
| 2 | COUNT SEQUENCE | COLUMN | COLUMN | COLUMN | COLUMN | COLUMN | COLUMN | R/W |
| 3 | HIGH/LOW | | BURST_LENGTH | BURST_LENGTH | BURST_LENGTH | DATA_CHANNEL | DATA_CHANNEL | PRECHARGE |

COLUMN BURST ACCESS TRANSACTION HEADER

FIG. 11

Pipelined Random Column Mode Header

| CYCLE # | CLKOUT | CHANNEL [0:7] | | | | | | |
|---|---|---|---|---|---|---|---|---|
| 1 | | PIPELINE | CLUSTER | CLUSTER | CLUSTER | BANK | REFRESH | DIRECT ACCESS | HIT/MISS |
| 2 | | PRECHARGE | COLUMN (MSB) | TRANS_LENGTH | TRANS_LENGTH | TRANS_LENGTH | DATA_CHANNEL | DATA_CHANNEL | R/W |

FIG. 12

Pipelined Random Column Write Packets

| CYCLE # | CLKOUT | CHANNEL [0:7] | | | | | | |
|---|---|---|---|---|---|---|---|---|
| PACKET 1 { 1 | | HIGH/LOW | COLUMN | COLUMN | COLUMN | COLUMN | COLUMN | COLUMN |
| 2 | | | DATA | DATA | DATA | DATA | DATA | DATA |
| PACKET 2 { 1 | | HIGH/LOW | COLUMN | COLUMN | COLUMN | COLUMN | COLUMN | COLUMN |
| 2 | | | DATA | DATA | DATA | DATA | DATA | DATA |

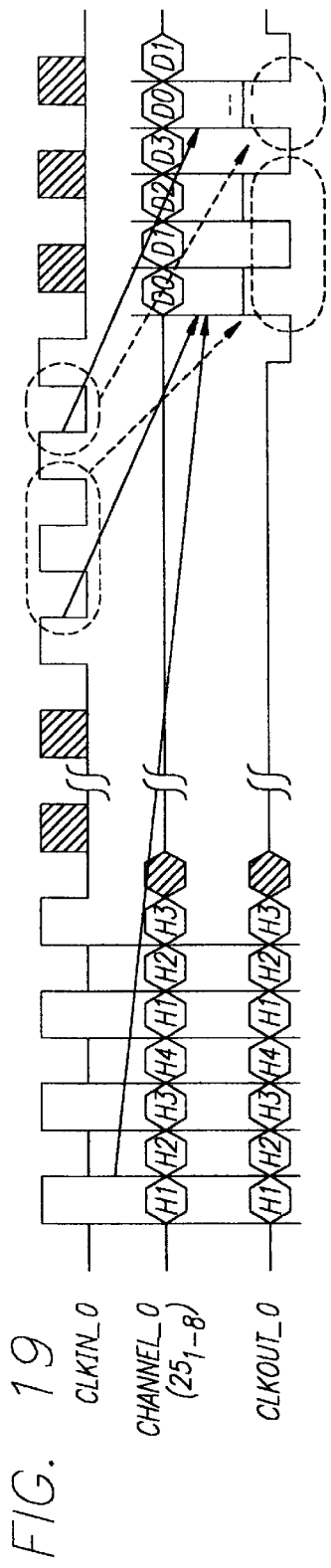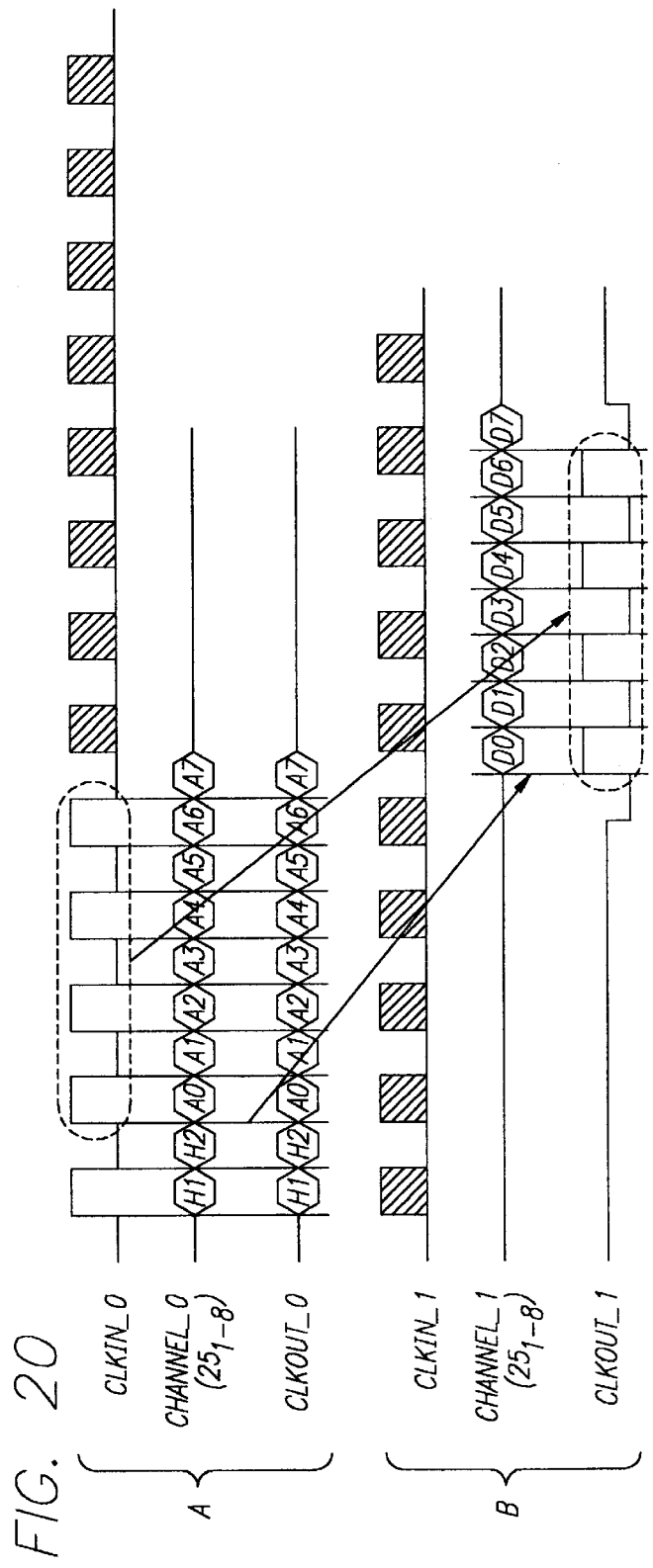
FIG. 19
FIG. 20

INDEPENDENT AND COOPERATIVE MULTICHANNEL MEMORY ARCHITECTURE FOR USE WITH MASTER DEVICE

RELATED APPLICATION

This application is a continuation of U.S. application Ser. No. 08/438,638, filed May 10, 1995, now abandoned, which is a continuation-in-part of application Ser. No. 08/346,694, filed Nov. 30, 1994, now abandoned. This application is related to copending U.S. application Ser. No. 09/073,332, filed May 6, 1998, U.S. application Ser. No. 08/650,415, filed May 20, 1996, and issued on Sep. 8, 1998, as U.S. Pat. No. 5,805,873, and application Ser. No. 08/756,050, filed Nov. 26, 1996, and issued on Sep. 15, 1998, as U.S. Pat. No. 5,808,487.

BACKGROUND OF THE INVENTION

1. Field of the Invention

The present invention relates to a high performance memory architecture for digital computer and video systems, and more particularly, to an architecture using two or more independent and cooperative channels that may be used to provide enhanced functionality, flexibility and performance.

2. Description of Related Art

Semiconductor computer memory integrated circuits (ICs) have traditionally utilized an internal architecture defined in an array having rows and columns, with the row-column address intersections defining individual data storage locations. These intersections are typically addressed through an internal dedicated address bus, and the data to be stored or read from the locations is typically transferred on a separate dedicated internal input/output (I/O) bus. In a similar manner, the data and address information is communicated between the memory IC and external devices by use of separate dedicated paths. Semiconductor memory configurations utilizing this basic architecture include Dynamic Random Access Memory (DRAM), Static Random Access Memory (SRAM), Electrically Programmable Read Only Memory (EPROM), Erasable EPROM (EEPROM), and so-called "flash" memory.

The architectural constraint of dedicated address and I/O buses has arisen due to simplicity and practical considerations relating to microprocessor operating frequency. Traditionally, microprocessors operated at a cycle time that was greater than or equal to the memory device latency (also referred to as access time), and the memory device I/O bus would become inefficiently delayed if address information were to be multiplexed onto the I/O bus. The advent of faster speed, pipelined microprocessors has challenged this basic architectural premise, and has driven a demand for ever increasing performance from the memory architecture with minimal associated cost increase.

One of the most important measures of performance for such memory devices is the total usable data bandwidth of the I/O bus, typically measured in megabytes per second (MB/sec). For example, a memory device having a single eight-bit (1 byte) wide bus that can operate at a maximum frequency of 33 MHz can deliver data at a rate of 33 MB/sec. Data bandwidth is often quoted as a theoretical maximum, or "peak bandwidth," which assumes the perfect case wherein data is transferred at a rate of a single byte per cycle without interruption. More realistically, however, the maximum usable bandwidth for a particular memory application is a somewhat smaller number and can vary widely for different applications utilizing the same memory device. For most applications with most types of memory devices, it is difficult in practice to utilize more than about 70% to 80% of the peak bandwidth of a memory device.

Usable data bandwidth is affected by two main types of timing delays: (1) access time; and (2) cycle time. Access time is defined as the delay between the arrival of new address information at the address bus and the availability of the accessed data on the I/O bus. Cycle time is determined by the maximum rate that new data can be provided to the memory device outputs. For standard DRAMs, cycle time for row accesses is significantly greater than associated access time due to the necessity of additional memory cell pre-charge operations before or after a memory access transaction; by comparison, asynchronous SRAMs have roughly equivalent cycle time and access time. Newer pipelined configurations of DRAMs and synchronous SRAMs have a cycle time that is significantly less than their access time.

Microprocessor frequency and performance have increased dramatically over recent years, and there has been an associated effort to increase the usable data bandwidth of memory devices in order to keep pace with the higher speed microprocessors. There has also been a trend toward reduction of the number of individual memory chips per system due in part to the faster increase in available memory chip density as compared to the average increase in system main memory size. Emerging multimedia and portable applications will generally require a very small number of DRAMs per system, e.g., less than four. Previous efforts to increase the usable data bandwidth have concentrated primarily on reducing access time and/or cycle time.

The least complex method of improving data bandwidth is to utilize SRAM chips having much faster access and cycle times than the much cheaper and higher density DRAMs; access time for typical SRAMs is in the range of approximately 15 nanoseconds (ns) versus 60 ns for DRAMs. SRAMs have a relatively high current output differential memory cell that is conducive to faster sensing techniques which enable the fast access time. While SRAMs have much higher data bandwidth, they are not without drawbacks. In particular, SRAMs require more area within the chip to store the same amount of information as DRAMs, and are thus more expensive to manufacture for a given memory chip density. In view of these drawbacks, SRAMs are usually confined to certain high performance applications requiring particularly fast access in which the additional cost can be justified.

One such application of very high speed SRAMs is for use within a secondary cache that is located off-chip from the microprocessor. Present microprocessors generally include an on-chip memory, known as a primary cache. The primary cache stores information that is most frequently used by the microprocessor, such as instructions and data. To increase microprocessor speed, it is desirable to increase the percentage of memory accesses in which desired data is stored in the primary cache, known as the "hit rate." Primary cache hit rates may typically range from 80% to 90%. If the desired data is not available in the primary cache, known as a "miss," the microprocessor then must access the data from the off-chip memory. A data miss can represent a significant time penalty for current microprocessors due to their extremely fast cycle time and their execution of multiple instructions in each cycle.

By adding some number of fast SRAMs off-chip, known as a secondary cache, the hit rate can be further increased to the 95% range. Low-end secondary cache applications generally combine multiple commodity eight-bit wide SRAM chips that operate at 12 to 15 ns access/cycle time in order to provide a thirty two-bit or sixty four-bit bus. The usable data bandwidth for such a secondary cache can be as much as 256 to 512 MB/sec. Despite the hit rate improvement due to secondary cache, however, even a 5% miss rate may be intolerable for certain systems. Another drawback of secondary cache memory is cost, because off-chip SRAM chips are three to four times more expensive than DRAM chips for the same bit density. For a microprocessor with a reasonably sized primary cache, e.g., sixteen to thirty two kilobytes (KB), the overall system improvement with a secondary cache may only be 10% to 15%, which may not be sufficient to justify the substantial increase in cost. Further drawbacks of secondary cache include printed circuit board area to contain the secondary cache, power dissipation and design complexity.

The secondary cache concept can be extended further for high end systems by defining specific SRAM architectures utilizing very wide data buses, pipelining techniques, burst counters and very high clock frequencies. Some of the new secondary cache SRAM configurations under development have sixteen-bit wide and even thirty two-bit wide buses, and operate at frequencies exceeding 100 MHz. These configurations provide very good performance, including usable data bandwidth on the order of 200 to 400 MB/sec per chip.

Notwithstanding these benefits, production costs of such new secondary cache SRAM configurations are significantly higher than commodity DRAMs. Further, die size, heat dissipation and pin counts are larger, and the device may require relatively expensive packaging, e.g., ceramic rather than plastic. Thus, large width secondary cache SRAMs are appropriate for certain applications, such as high end work stations and personal computers, but are too expensive and power consuming for consumer applications, such as lap-top computers, hand-held personal data assistants (PDAs), and the like, many of which still demand the highest possible level of performance.

In contrast, DRAMs are by far the most widely used type of semiconductor memory device due to their low cost and reasonable data bandwidth. At present, however, state of the art DRAMs have significantly slower random row access times than SRAMs, having approximately 60 ns access and 100 ns cycle times to randomly access any row within the device. This performance corresponds to an operating frequency of only 10 MHz, which for an eight-bit wide DRAM equals a data bandwidth of only 10 MB/sec. Current standard microprocessors are already approaching 100 MHz internal cycle times. For a thirty-two bit memory data bus, the performance requirement would be 400 MB/sec, which is far beyond the bandwidth capacity of the standard DRAM architecture.

Until the present time, most DRAMs have been used in memory systems containing many individual DRAM chips (such as large computers, work stations, etc.). In such systems, slightly higher bandwidth could be achieved at the system level by accessing many DRAMs in parallel at the same time to provide a wider effective memory bus, and also by use of so-called interleaving techniques. Interleaving comprises the use of two groups of DRAMs in which a first group of DRAMs is accessed while an access operation of a second group is already underway. The returning data from both groups is then provided on the same data bus, but out of phase from each other. The use of separate address and data buses makes interleaving possible. Performance improvement techniques such as interleaving can reduce the memory system bus cycle time by up to half that of any of the DRAMs individually; however, these techniques are unusable for the majority of systems that contain only a very small number of DRAMs. Finally, the DRAM performance shortfall can be mitigated somewhat by increasing the data bus width of the individual DRAM chips, such as from eight to sixteen bits. Still, this is a short term improvement that has cost drawbacks in terms of increased chip area, power requirement, and package cost, without significantly closing the performance gap between DRAM bandwidth and system requirements.

All DRAM architectures have an inherently faster column access time than their associated row access time. This aspect arises due to the very nature of the DRAM memory cells and sensing structures. Each DRAM memory cell is a very small capacitor which provides a very small voltage signal on the bit lines that must be read very slowly and carefully in order to guarantee that the correct data is sensed during a row read operation. The small voltage levels are actually destroyed during the read operation, providing a so-called destructive read. The sensing operation must therefore restore full voltage levels back on the bit lines in order to refresh the memory cell upon completion of the row access. Due to this requirement, the bit line sense amplifiers must be constructed of differential latch circuits which are topologically similar to a six transistor SRAM memory cell.

As a natural consequence of this configuration, completely random row access times into any memory cell location of the DRAM are very long (on the order of 60 ns for current technology). In a column access, by contrast, data is read directly from the much smaller number of enabled high current bitline sense amplifiers, providing a row cache capability. Therefore, the access time for column access operations can be more than twice as fast as for a row access, and is analogous to the faster SRAM access time. Unfortunately, only a very small percentage of the memory device can be accessed at the faster latency at any given time. Memory system designers have attempted to structure the devices to take advantage of the faster column access, albeit with limited success. The current trend toward smaller numbers of chips within a memory system greatly exacerbates this situation, as the number of independent row locations that can be enabled to provide the faster column accesses is reduced as the number of chips per system decreases. As a result, the "hit rate" on these so-called row caches becomes so low that the increased complexity associated with this mode is not justified in terms of cost and performance of the final system.

A different approach to improving data bandwidth is to concentrate instead on reducing the cycle time of the memory device, rather than the access time. One way to provide a cycle time enhancement is to utilize a pipelined structure, as in the synchronous SRAMs mentioned previously. Other examples of pipelined structures include Extended Data Out (EDO) DRAMs, synchronous DRAMs, and RAMBUS™ DRAMs (or RDRAMs).

The most evolutionary modification to the standard DRAM architecture is the advent of the EDO DRAMs. This is a relatively minor modification to the column mode circuitry of the DRAM which allows a faster usable column mode cycle time within a system environment. Row and column access times are unchanged from the standard DRAM architecture. A further enhancement of this technique is a Burst EDO, in which a burst counter is added to the DRAM to allow sequential data bytes stored within the device to be accessed without having to supply new addresses for each data byte. Instead, the burst counter supplies the addresses. These EDO DRAM architectures are expected to achieve data bandwidth rates in the 132 MB/sec range for sixteen-bit devices in the near future.

A more sophisticated evolutionary approach to achieving higher pipelined bandwidth is the synchronous DRAM, in which a master clock signal and other architectural enhancements provide faster usable burst cycle times than either EDO or Burst EDO DRAMs. In synchronous DRAMs, data available on column sense amplifiers following a row access is used to create a burst mode, which can reduce cycle time to the 10 ns range. Subsequent data can be streamed out from the column sense amplifiers at 10 ns intervals due to the pipeline configuration, which results in a 100 MHz data rate. Synchronous DRAMs have a random access time of about 60 ns, and a column access time of about 30 ns. At present, synchronous DRAM configurations are 8-bits wide and 16-bits wide, the latter providing a peak data bandwidth of 200 MB/sec.

A further architectural feature of synchronous DRAMs is the subdivision of the memory array into two independently addressable banks to improve channel utilization in certain applications. While one bank is in the middle of a burst transaction, row addresses can be provided to the other bank to minimize a row access latency. This can be useful in applications such as graphics, in which the next row addresses can be provided during burst transactions from the other bank. This allows very high utilization of peak data bandwidth for some graphics applications. However, the two banks provide only two independent row cache locations, which are not enough to allow significant row cache hit rates for systems with a small number of DRAM chips.

The RAMBUS™ DRAMs increase the pipelined burst bandwidth by use of an extremely fast nine-bit wide channel that achieves peak bandwidth of up to 528 MB/sec, as described in U.S. Pat. No. 5,319,755. System cost is reduced by the multiplexing of all address, data and control information on the single nine-bit bus, which becomes feasible due to the extremely fast burst cycle time. Actual usable bandwidth can actually be significantly lower than this, due to very long row and column latencies (e.g., up to 128 ns for current sixteen Mbit RAMBUS™ versions) as compared with other DRAM architectures, and the inability to hide these latency penalties due to the single channel for address, data and control information. The RAMBUS™ DRAMs provide two memory banks per chip, which can theoretically provide a usable system row cache for systems having a large number of chips on the single channel; however, this row cache concept would not be effective for relatively small systems that are expected in the future, due to the very small number of total row cache locations available to the system.

Yet another approach to increasing usable data bandwidth for virtually any application is to increase the number of ports that are available to access the individual storage locations within the memory device. For video graphics applications, specialized architectures called VRAMs have been implemented. A VRAM comprises a dual-port DRAM architecture optimized for graphics or video frame buffers. In bit-mapped graphics, pixels on the screen are directly mapped to locations within a DRAM frame buffer array. The number of DRAM bits per pixel can be as much as 32 bits/pixel or more for certain high end applications, such as three-dimensional graphics.

The VRAM primary port is similar to that of a common DRAM, with row and column access modes, but no burst mode. The secondary port is a serial port that provides a serial output from the VRAM frame buffer to update the red, green, and blue outputs to the video screen, typically through a RAMDAC, e.g., a color look-up table. Improved performance results from this secondary serial port, as all data is taken from the secondary port for updating the video without impacting throughput of the primary port. Thus, the peak usable data bandwidth represents the sum of the bandwidth associated with the primary DRAM port, plus the bandwidth associated with the secondary port.

Although improved performance is attained, VRAMs have a severe cost penalty relative to commodity DRAMs. The chip die size penalty for the serial port registers is substantial, and in some cases can be as much as 50%. Other factors contributing to the higher cost are lower sales volume, higher package cost due to more pins, and added features geared for graphics applications that are underutilized in practice. Further, the two VRAM ports operate completely independently and cannot cooperate to improve the utilization of each other. Typically, VRAMs have a 60 ns random access time for the primary port, and a 25 ns serial-mode access time for the serial port. As the frequency of competing memory architectures continues to increase (as in the present invention), the advantages of the VRAM architecture will diminish since the screen refresh rate will eventually represent only a small percentage of total available bandwidth. Thus, it would be inefficient to dedicate a port solely to providing screen refresh.

Finally, a dual port SRAM architecture has been implemented for use with certain multi-processing applications. This architecture has two functionally identical ports that can generally operate simultaneously to access any memory location within the array, including the same memory cell (although simultaneous writes to a common location are not permitted to avoid data ambiguity). Resultant dual port SRAM data bandwidth is equivalent to both ports operating simultaneously at maximum frequency. This architecture typically has access times comparable to or slightly slower than a normal SRAM, from either port.

Unfortunately, this performance advantage is obtained at a significant cost. The memory cells themselves have a dual port structure, with essentially a complete replication of the entire address and data path from the memory cells to the external chip connections for each port. Other than some arbitration logic, the circuitry is not significantly different from standard SRAM circuits. The dual port SRAM devices are expensive because the memory cells and replicated periphery require two to four times the amount of area on the chip than normal SRAM circuitry for the same density, and the packaging cost is higher than normal because of the larger number of external connections for the dual address and data buses. In fact, dual port SRAMs can be four to eight times as costly as commodity DRAMs at a cost per bit basis. As a result of this high cost, use of dual port SRAMs is limited to a narrow range of applications which do not require a very large number of memory locations (which further exacerbates the cost penalty due to lower manufacturing volumes). Since the dual port SRAMs have separate address buses for each channel, there is no significant need or capability for the channels to cooperate with each other to enhance the usable data bandwidth.

In summary, a critical need exists for a multiple port, high data bandwidth memory architecture that can be implemented at low cost, with little additional silicon area, very low power dissipation, and with the minimum possible number of pins on an IC package. The architecture should permit flexibility in its use, and should minimize latency, cycle time, and utilization penalties by permitting the channels to operate completely independent of each other when appropriate, or to intelligently cooperate with each other to increase performance. Preferably, such architecture should be readily implemented using high density commodity integrated circuit chips, such as DRAMs, EEPROMs or flash memory, and should even be capable of further improving the usable data bandwidth of commodity SRAMs.

SUMMARY OF THE INVENTION

In accordance with the teachings of the present application, an independent and cooperative multichannel memory architecture is provided. The multichannel memory architecture permits at least one master device to store and retrieve data utilized by the master device in data read and write transactions.

Generally, the multichannel memory architecture comprises at least two independent memory clusters and at least two multi-line channels respectively coupling the master device to at least one of the clusters. Each of the memory clusters have a plurality of individually addressable data storage locations, with each of the data storage locations having distinct column and row addresses. The individual data storage locations within the memory clusters are single ported, and access from multiple external ports is managed by peripheral logic within the memory clusters. The multi-line channels are each adapted to carry both data and address information for conducting selected data read and/or write transactions between the master device and the clusters. The clusters each further comprise one or more independently addressable memory banks. Further, the multichannel memory architecture permits a plurality of master devices to be coupled to the multi-line channels for conducting selected data read and/or write transactions within the clusters.

The multi-line channels provide a plurality of distinct operating modes for the selected data read and/or write transactions. These operating modes include: (a) an independent mode in which independent data read and/or write transactions can occur simultaneously within distinct ones of the clusters through distinct ones of the multi-line channels; (b) a cooperative mode in which a first one of the multi-line channels provides address and control information for a particular transaction and a second one of the multi-line channels provides data associated with the particular transaction; and, (c) a synchronous mode in which at least two of the multi-line channels are synchronized together to provide a wider effective channel to provide data associated with a particular read and/or write transaction to two or more clusters simultaneously.

A more complete understanding of the independent cooperative multichannel memory architecture will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 8 illustrates a header format for a row access read/write burst transaction within the multichannel memory device;

FIG. 9 illustrates a header format for a background row change;

FIG. 10 illustrates a header format for a column access read/write burst transaction;

FIG. 11 illustrates a header format for a pipelined random column access read/write burst transaction;

FIG. 12 illustrates a format for pipelined random column write data packets;

FIG. 19 is a timing diagram illustrating a column read header transmitted into a bank following the header of a previous row burst read transaction;

FIG. 20 is a timing diagram illustrating a pipelined random column read mode transaction;

DETAILED DESCRIPTION OF THE PREFERRED EMBODIMENT

Figure 1:
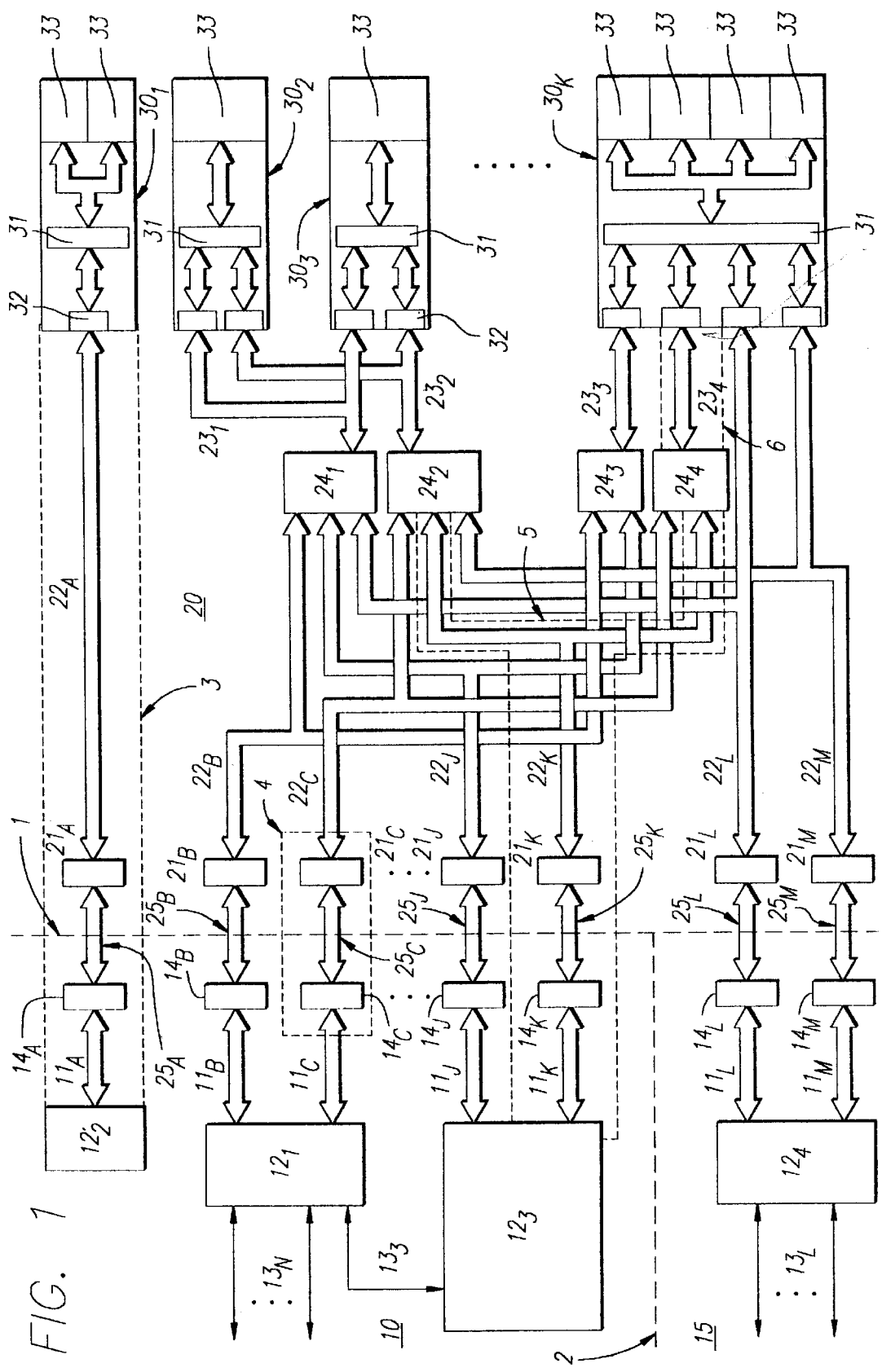
FIG. 1 is a system level block diagram of a multichannel memory architecture of the present invention.

The present invention satisfies the critical need for a multiple port, high bandwidth, low latency memory device architecture that can be implemented at low cost, with low power dissipation, and with a minimum number of interface lines between the memory device and an associated controller device (such as a central processing unit, graphics controller, memory controller, etc.). The architecture is highly flexible in that it permits multiple separate data channels to operate either independently from each other, cooperatively (in which one channel provides address and control information for a data transfer on another channel), or synchronously (in which multiple channels are operated concurrently to provide a wider effective channel for a particular data transfer operation).

One of the fundamental features of this architecture is the use of the same lines of a data channel for both address and control information, as well as for bi-directional data transfers. Data read and write operations within the memory device are organized into discrete "transactions," with each such transaction initiated by several sequential data words termed a "header." The header includes address and control information for a subsequent transfer of one or more bytes of data into or out of the memory device. The header can be applied to one channel for a subsequent transaction across that same channel or across another channel.

More specifically, each transaction comprises a read or write operation in which data is transferred across a boundary between the memory device and the controller device. There are other types of data operations, referred to as "background" operations, in which data is transferred only within the memory device. These background operations are also initiated by sequential header words generally similar in form to the transaction headers described above.

At any given moment, the data channels can operate either independently of each other within different regions of the memory device, or can cooperate intelligently with each other to operate more efficiently within one particular region of the memory device. These modes of operation may be constantly changing during normal operation of the memory device. For example, one channel could be primarily operating within one particular region of the memory device, but could occasionally provide address and control information regarding another region of the memory device in order to support data transactions from the other region through a different channel to the controller device.

The present memory architecture can be implemented using relatively inexpensive and high density commodity DRAM chips, without substantially increasing the amount of area required on each such chip. Further, the memory architecture also applies to discrete SRAM, flash or other types of memory technologies, as well as embedded DRAM, SRAM, etc. In the detailed description that follows, it should be understood that like reference numerals are utilized to identify like elements of each of the various figures.

Referring first to FIG. 1, a system level block diagram of a multichannel memory architecture of the present invention is illustrated. The memory architecture comprises a plurality of M independent data channels, identified in FIG. 1 as channels A and B through L and M, where M represents a channel number greater than or equal to two. The channels A through M each cross over a boundary 1 that defines an interface between a memory device 20 and one or more master devices, such as master devices 10 and 15 separated by boundary 2 of FIG. 1. The master devices 10, 15 and memory device 20 may each be disposed on separate IC chips, or may comprise separate elements within a single IC chip, such as distinct processor logic units and an associated embedded memory space.

The memory architecture further comprises a plurality of K individual memory clusters 30, including memory clusters $30_1$, $30_2$ through $30_K$, where K represents a number greater than or equal to two. Each one of the memory clusters 30 comprises a unit of memory space within the memory device 20 capable of processing only one transaction at a given time. With K memory clusters 30 and M data channels, it becomes possible with the present invention to have multiple independent memory transactions occurring at the same time, so long as each transaction occurs within different clusters. The maximum number of transactions that can occur at one time is limited by the smaller of M or K.

The data channels A through M each further comprise multi-line buses capable of carrying information defined into discrete information packets. The width of the buses comprising each of the channels A through M is fixed by a predefined signal protocol definition for the memory device 20, such as eight or nine bits wide. It is anticipated that the width of an individual port will continue to grow in the future as memory devices continue to increase in size. The individual ports may be sixteen or eighteen bits wide, or even wider, with appropriate modification to the transaction protocol. For simplicity of description, the present application will describe the significant aspects of the memory architecture in terms of an eight bit data bus.

To increase the effective width of the total data bus to larger values for a particular read or write transaction (such as sixteen, thirty-two or sixty-four bits wide), multiple channels can be operated simultaneously, with the limitation that each channel accesses a different cluster within the memory device. In this type of transaction, nearly identical address and control information headers would be applied to each of the multiple channels at the same time. Subsequent transfer of data on each of these channels can be synchronized to provide an effectively wider channel.

Master communication ports $14_{A\text{-}M}$ are disposed on the master side of the interface boundary 1, and slave communication ports $21_{A\text{-}M}$ are disposed on the memory side of the interface boundary. These ports $14_{A\text{-}M}$, $21_{A\text{-}M}$ provide data buffering in both directions, and clock transition circuitry from the interface clocking environment to and from the master device and memory device clocking environments. The master ports $14_{A\text{-}M}$ may additionally include protocol generation logic that translates address and control signals on the buses 11 to the header protocol format required by the memory device, and the slave communication ports $21_{A\text{-}M}$ may further provide some header protocol decoding logic as well. Alternatively, this protocol generation function could take place in one or more of the logic units 12 (described below) included within the master devices, and the data buses 11 would carry the header information already in the protocol format. Further details of the port circuitry will be provided below with respect to FIGS. 2(A) and 2(B).

The master devices 10, 15 further include controller logic units $12_{1\text{-}4}$ that represent standard units normally associated with CPU or controller circuits, such as arithmetic logic units, floating point units, instruction and/or data cache circuits, graphics or multimedia units, etc. Alternatively, one or more of the logic units $12_{1\text{-}4}$ could represent specific circuitry dedicated solely to the memory interface. These logic units $12_{1\text{-}4}$ optionally could provide protocol generation as described previously (if not provided in the ports $14_{A\text{-}M}$), and could provide scheduling of the channels under their particular control. An example of this scheduling function would allow transaction packets to continually arrive from elsewhere within the master device 10 across bus 13, and logic unit $12_1$ would chose between channels B and C to route the transaction. It should be apparent that there are many possible permutations with this type of scheduling architecture, as optimized for each particular application.

Data may be transferred between the logic units $12_{1-4}$ and the respective channels, or may be transferred between individual ones of the logic units. For example, logic unit $12_3$ is capable of simultaneous communication with the memory device 20 across channels J and K, and also through pathway $13_3$ to logic unit $1_1$ to channels B and C. In contrast, logic unit $12_2$ is only connected with the memory device 20 through channel A to cluster $30_1$, with no other communication on either side of the interface 1. This single channel could be used to access a completely secure data space, such as for storing operating system information.

The master device 15 is separated from master device 10 by interface 2, which may comprise a boundary between separate chips or may be an artificial boundary within a single chip. Since the logic unit $12_4$ disposed on the master device 15 can access memory clusters $30_{2-K}$ through channels L and M, it is necessary that the accesses to these clusters be arbitrated with accesses across the other channels. There are three ways to accomplish the arbitration. First, control signals can be routed between the logic unit $12_4$ and one or more of the other logic units $12_{1-3}$. The logic units $12_{1-4}$ can then share scheduling information through these control signals which can determine the order of access to the clusters. Second, a central control unit (not shown) can handle scheduling and control over all accesses to all clusters, and can include buffer memory and scheduling logic to most efficiently utilize the channels A through M to maximize the total usable bandwidth for a particular application. Third, the logic units $12_{1-4}$ can avoid scheduling problems altogether by including some additional circuitry in each of the clusters. As described in greater detail below, each of the clusters includes a next-up register that temporarily stores pending address and control information until the present transaction is complete. If the next-up register includes enough space to hold address and control information from each of the channels, then there would be no need for central control over scheduling, as long as each channel would only provide a single pending transaction at a time to any individual cluster. The next-up register can then provide the address and control information in a first in-first out (FIFO) manner.

It should be apparent that use of one or more of these techniques would allow the elimination of so-called handshaking between the master devices 10, 15 and the memory device 20. Moreover, the memory device 20 can avoid the use of complex and area-consuming arbitration logic. Device latency is minimized due to the removal of status communication between the master and slave devices during the transaction, and the available bandwidth would increase due to the elimination of handshaking information traffic on the channels.

The memory device 20 further includes multiplexer units $24_{1-4}$ which couple individual ones of a plurality of the channels to one or more of the memory clusters 30. More specifically, each individual one of the data channels A through M comprises the entire data path between an originating point on the master devices 10, 15 to one or more clusters 30, and includes respective ones of the ports $14_{A-M}$, $21_{A-M}$. For example, channel A extends from logic unit $12_2$ through bus segment $11_A$ to port $14_A$ to bus segment $25_A$ to port $21_A$ to bus segment $22_A$ to cluster $30_1$, and is shown at 3 of FIG. 1. Similarly, channel K is shown at 5 of FIG. 1, and includes bus segment $22_K$ and leads into multiplexers $24_2$ and $24_4$. If a transaction is occurring between logic unit $12_3$ of master device 10 and cluster $30_K$, then channel K would include the bus segment $23_4$, shown at 6 of FIG. 1. After the transaction is completed, subsequent transactions could be implemented simultaneously on channels C and K, in which the bus segment $23_4$ would become part of channel C for a new transaction, and bus segment $23_2$ would then temporarily become part of channel K.

Figure 5:
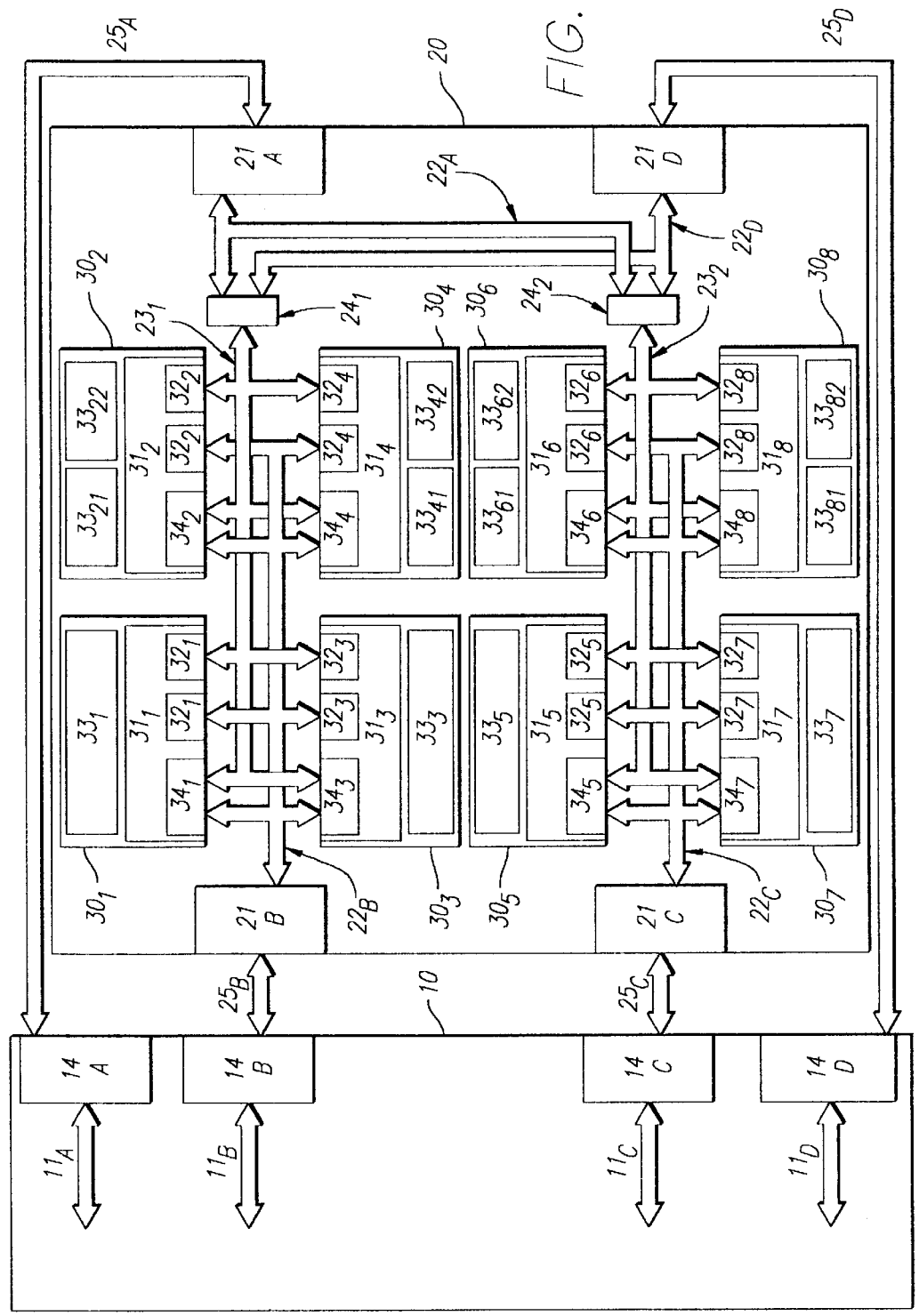
FIG. 5 is a system level schematic drawing showing a four-channel interface between a master device and a multichannel memory device of the present invention.
Figure 6:
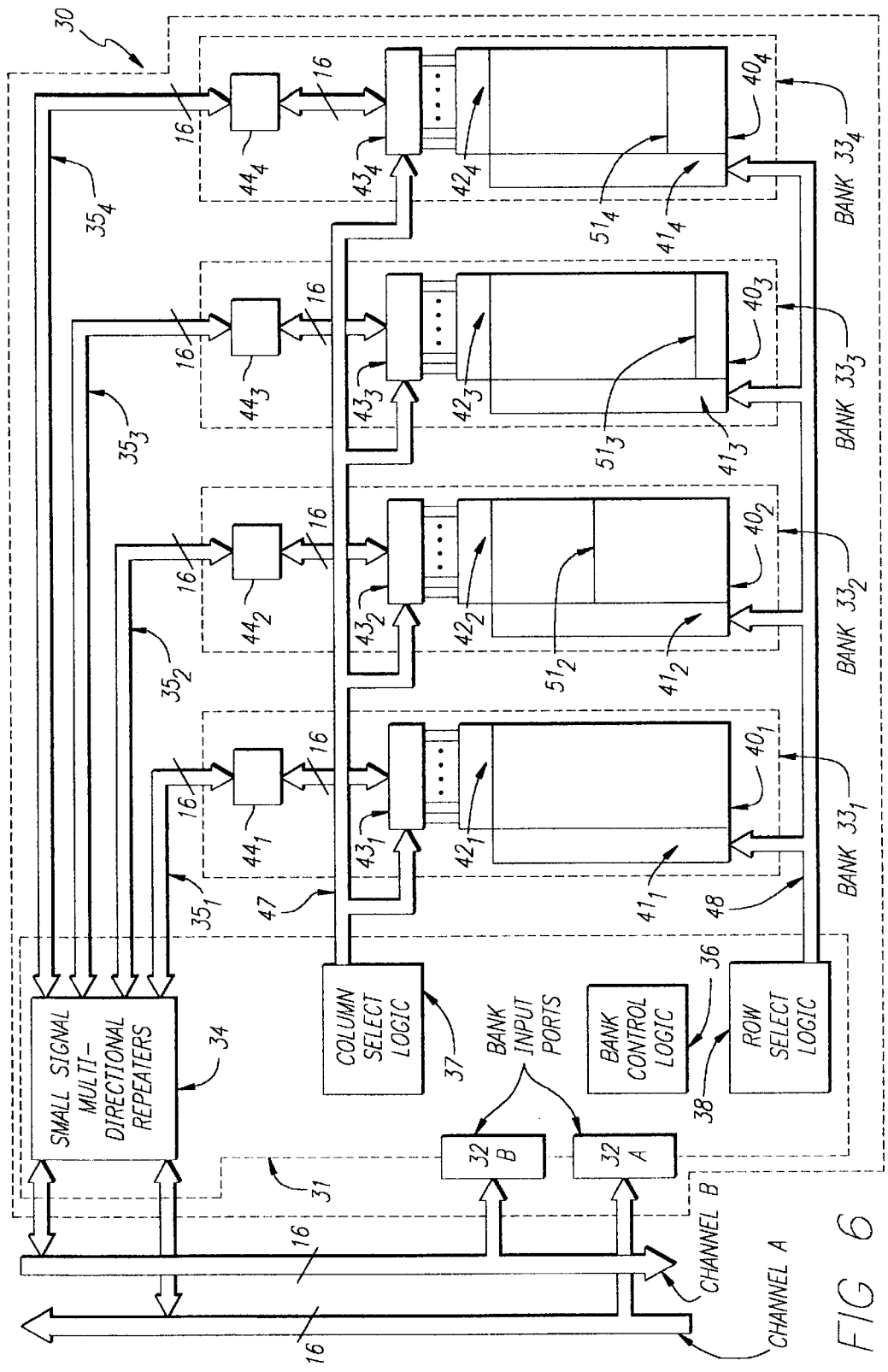
FIG. 6 is a block diagram of a single memory cluster of the multichannel memory architecture.

The individual memory clusters 30 each further comprise respective input port elements 32, a control element 31, one or more memory banks 33, and a multi-directional signal repeater 34 (shown in FIGS. 5 and 6). There is an input port element 32 associated with each channel or multiplexer connection. The control element 31 is coupled to all of the input port elements 32 of the particular memory cluster 30, and is further coupled to the memory banks 33. Data retrieved from one of the memory banks 33 during a read transaction is routed to one of the channels by the control element 31.

As will be further described below, each of the memory banks 33 comprise a plurality of primary sense amplifiers that are activated for a single row access, along with a generally much larger plurality of memory cells that are accessed by the primary sense amplifiers. Where there are multiple banks 33 within a single cluster 30, it is possible to have the memory cell data associated with different row addresses latched into the different banks. Typically, these sense amplifiers can be structured as latches to hold the data that has been read or written until a new access or precharge operation is initiated on the particular bank 33. The size of individual banks 33 may be different within a particular cluster 30 or across clusters, and the number of internal banks 33 may be different within the various clusters.

CLOCK CONTROL ARCHITECTURE

Figure 2A:
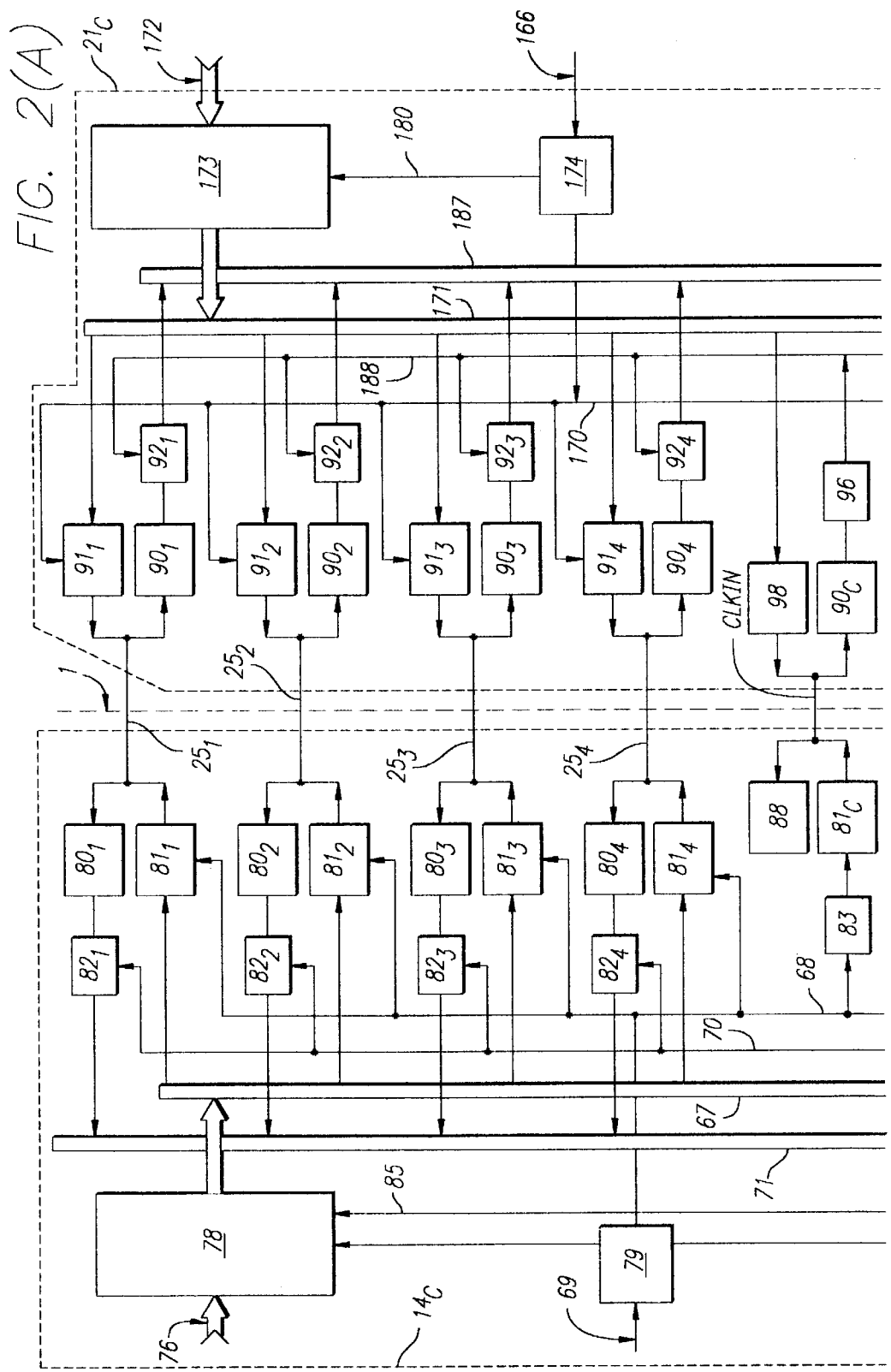
FIGS. 2(A) and 2(B) are block diagrams of a master and slave port communication architecture of the system of FIG. 1.
Figure 2B:
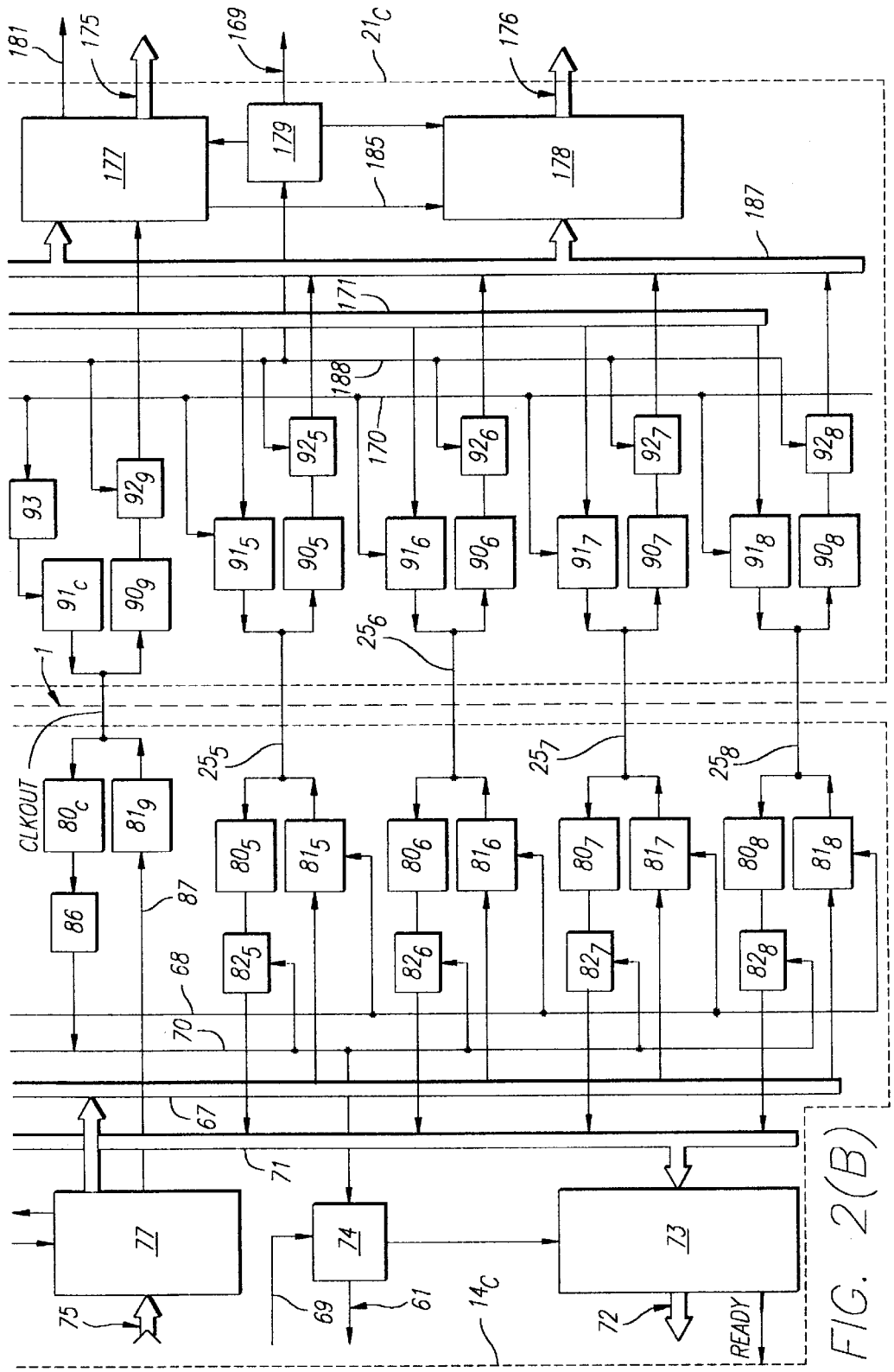

FIGS. 2(A) and 2(B) show a detailed view of the master and slave ports $14_C$ and $21_C$ of channel C that are contained within 4 of FIG. 1. Note that FIGS. 2(A) and 2(B) should be read together to provide a single figure. One of the fundamental features of the present invention is a unique method of clock synchronization for data transfer in both directions across boundary 1. Under this clock synchronization technique, the clock signal follows slightly after the data transferred across the interface in either direction. After the data has crossed the interface, the clock continues to propagate with the data, independent of transactions on other channels. Accordingly, each transaction can occur asynchronously and independently with respect to other transactions on other channels to other clusters.

The clocking scheme and overall operation of the present application is independent of I/O signal levels, and could be applied to any signal levels that could be used for chip-to-chip communication (such as low voltage transistor-transistor logic (LVTTL), etc.), including differential signal transfer schemes that require two pins for each signal. It should be apparent from the description which follows that similar architecture is incorporated for each of the other channels coupling the master and slave devices of FIG. 1.

The master port $14_C$ comprises a protocol control unit 77, master read and write data buffer units 73, 78, a synchronization control unit 79, data line buffer units $80_{18}$ and $80_C$, $81_{1-9}$ and $81_C$, data latches $82_{1-8}$, delay units 83 and 86, and a dummy data input buffer 88. The master port $14_C$, further comprises internal multi-line buses 67 and 71 that handle outgoing and incoming data, respectively, with the multi-line bus 67 also handling outgoing command and address information. The buffer units $81_{1-9}$ and $81_C$ convert the voltage level of the signals, such as from a full rail CMOS voltage to a signal level that is more efficient for propagation across the interface. The buffer units $80_{1-8}$ and $80_C$ operate in reverse, by converting the signal voltage levels of received signals to levels appropriate for the master device 10, such as full rail levels. The dummy data input buffer unit 88 does not receive a signal from the memory device, but is instead intended to match the parasitic capacitance of the CLKIN line to that of the bus $25_{1-8}$ and the CLKOUT line. Write data provided from the master device to the channel passes through bus 76 to the master write data buffer unit 78 to output bus 67, and read data provided to the master device from the channel passes through the input bus 71 to the master read data buffer unit 73 to bus 72. The protocol control unit 77 generates the header protocol information from data provided by the master device on bus 75, and places the address and control information that comprise the header onto the output bus 67 and signal line 87.

Similarly, the slave port $21_C$ comprises a protocol control unit 177, slave input and output data buffer units 178, 173, a synchronization control unit 179, data line buffer units $90_{1-9}$ and $90_C$, $91_{1-8}$ and $91_C$, data latches $92_{1-9}$, delay units 93 and 96, and dummy output buffer 98. The slave port $21_C$ further comprises internal multi-line buses 187 and 171 that handle incoming and outgoing data, respectively, with the multi-line bus 187 also handling incoming command and address information. Write data provided to the memory device from the channel passes through the bus 187 to the slave write data buffer unit 178 to bus 176, and read data provided to the master device from the memory device passes through bus 172 to the slave read data buffer unit 173 to bus 171. The buffer units $91_{1-8}$ and $91_C$ operate similar to the buffer units $81_{1-9}$ and $81_C$, by converting the voltage level of the signals from the internal chip voltage levels to signal levels optimized for transfer across the interface 1. The buffer units $90_{1-9}$ and $90_C$ operate by converting the signal voltage levels in the reverse direction. The header protocol information received from the master device passes through the bus 187 to the protocol control unit 177, and is provided to the memory clusters through buses 175 and signal lines 181.

More specifically, address and control information is generated within the master device 10, and provided to the protocol control unit 77 by a multi-line bus 75 (such as bus $11_C$ of FIG. 1). It is anticipated that the address and control information on bus 75 be provided in any format, for any bus width, and at any frequency, and the protocol control unit 77 converts the address and control information to the desired nine bit wide output on bus 67 and signal line 87, in accordance with the protocol format that will be described below. It is further anticipated that the output bus width be expandable as necessary by protocol extensions to accommodate larger address spaces. Alternatively, the conversion function provided by the protocol control unit 77 could also be embedded within the main device controller logic units $12_{1-4}$, or could reside in some other remote location from channel port 14. For example, the central control unit described above could handle scheduling and buffering for all transactions to and from the memory device 20. In that case, the protocol control unit 77 could comprise a simple buffer, such as a set of multi-directional, small signal repeaters, as will also be further described below.

The synchronization control unit 79 is used to synchronize the channel clocking environment with the clock of the master device 10. The synchronization control unit 79 receives a clock input 69 from the master device or one of the main device controller logic units $12_{1-3}$ and provides an output clock 68 that is used to synchronize each of the data line buffer units $81_{1-9}$ together. The output clock 68 further passes through respective delay and buffer units 83 and $81_C$ to become a clock signal provided to the memory device, referred to as CLKIN. If it is desired that channel C operate at the same frequency as the master clock or a respective one of the master device controller logic units $12_{1-4}$, the synchronization control unit 79 may simply comprise of buffer and delay logic. If instead the channel C clock is a multiple or fraction of the master clock, the synchronization control unit 79 may comprise of digital frequency modification logic that is well-known in the art, such as frequency doublers, dividers, etc. The channel C could also be operated at a non-trivial frequency ratio of the master clock by use of conventional phase locked loop (PLL) or delay locked loop (DLL) techniques.

The output clock 68 operates simultaneously with the bus 67, and enables the respective ones of the buffer units $81_{1-9}$ to receive the address/control data on bus 67, with each of the buffer units holding one bit of the address/control data. At the same time, clock 68 is transmitted through delay unit 83 into buffer unit $81_C$. Buffer unit $81_C$ is substantially identical in structure and delay to the buffer units $81_{1-9}$. Thereafter, CLKIN flows slightly behind the data that is transferred onto the buses $25_{1-8}$ and the CLKOUT line. As will be further described below, the CLKOUT line is unused for synchronization while data is being transmitted from the master port $14_C$ to the slave port $21_C$, and thus can be used as an additional data port for transfer of address and control information. The CLKIN signal is transmitted across boundary 1 slightly after the data by virtue of a controlled delay introduced by the delay unit 83 on the clock path.

This completely synchronized but slightly delayed transfer of CLKIN following data across the chip boundary 1 is integral to enabling very high speed clock synchronization without the use of phase locked loop or other analog circuitry in the interface ports 14, 21. This technique could be considered an extension of the clocking technique described below with respect to the multi-directional small signal repeaters. In that case, the clock travels slightly behind the data to guarantee correct latching and amplification of the data into the next stage. It should be apparent that this clock synchronization technique can be generalized to any pipelining situation in which a data channel is synchronized by a slightly delayed clock, even if the data is travelling at full CMOS levels.

Another key component of this high speed, pipelined capability is the use of point-to-point communication between the master device and the memory device. Signal reflections in the signalling environment are minimized to begin with (due to the very low overall parasitic capacitance of the off-chip environment), and can be ultimately ignored on the receiving device by requiring the transfer of a clock signal synchronized with but slightly delayed from the transferred data. This is necessary in both directions across the interface 1. For practical reasons, the preferred embodiment of the present application requires separate clock pins to synchronize the data for each direction, although the same synchronization function could be achieved with a single clock pin. The transferred clock signal (CLKIN when data is transferred to the memory device, and CLKOUT when data is transferred from the memory device) is used to latch in the data within a precise time window after the data has been reliably received. It is possible to very carefully create signalling environments and I/O levels where multiple signal reflections can be tolerated with this signalling scheme, thus multiple chip connections are not precluded by the present application.

The master write data buffer unit 78 is used only for data write operations from the master device to the memory device. Data that is to be written into a selected address within the memory device is provided to the master write data buffer unit 78 by the multi-line data bus 76. As set forth in greater detail below, write transactions are structured using a sequence of header bytes containing address and control information (such as up to four bytes) followed by one or more bytes of write data. The master write data buffer unit 78 buffers the write data from the frequency and bus width environment of the master device to the byte-wide, high speed clocking environment of the channel. In an embodiment in which the data transfer frequency on the multi-line bus 76 is the same as the outgoing bus 67 (such as having the same frequency and same width, or half frequency and double width, etc.), the master write data buffer unit 78 can actually be a relatively shallow buffer, requiring a very small amount of circuitry. Alternatively, some systems may require a much deeper buffer 78, either to match very dissimilar data frequency environments, or to allow greater decoupling of the channel operation from the overall controller operation.

Once the header bytes have been transmitted from the protocol control unit 77 sequentially onto the outgoing bus 67, and have been subsequently transferred in a pipelined fashion across chip boundary 1 through bus $25_{1-8}$, and CLKOUT, the bus 67 becomes available after the last header byte to transmit the data from the master write data buffer unit 78 through bus 67 to bus $25_{1-8}$. This operation is initiated and controlled by control signals 85 from the protocol control unit 77 to enable the write data buffer unit 78.

In order to save valuable IC package pins, the CLKOUT bus can be used as an additional pin to carry header information from the master device to the memory device. The CLKOUT signal is used primarily for the synchronization of the read data transmitted from the memory device back to the master device, but this bi-directional bus is also available for use to carry an additional bit of header information, since a new header packet cannot be transmitted on the channel at the same time that a read transaction from the memory device is occurring on the same channel. During the actual cycles in which the byte-wide write data is transferred from the master write buffer unit 78 to the memory device, the CLKOUT signal is unused; however, the CLKOUT signal could alternatively be defined to carry a ninth data bit or some other type of control information. In FIG. 2, the signal line 87 carries one of the header bits directly from the protocol control unit 77 to buffer unit $81_9$. It is necessary to match the delay of the signal line 87 to that of the bus 67, so that the header signal propagation on the CLKOUT bus from the master device to the memory device matches the signal propagation of bus $25_{1-8}$.

On the slave port $21_C$ side, the buffer units $90_{1-9}$ receive the data line signals across the interface 1, followed by the CLKIN signal to the buffer unit $90_C$ after the slight delay. The data line signals are then transmitted to data latches $92_{1-9}$. Receiver block $90_C$ takes the slightly delayed CLKIN signal and adds a further small delay from the delay unit 96, providing input clock 188. The clock 188 closes the appropriate latches $92_{1-9}$, which have reliably received the data from the buffer units $90_{1-9}$ by the time the clock signal arrives. Once the data has been correctly latched into the latches $92_{1-9}$, it is propagated into either the protocol control unit 177 (address or control information) or the input data buffer unit 178 (write data) through bus 187.

Most of the address and control information defined within the header is decoded subsequently when it arrives at the individual memory clusters 30, but some additional header predecoding logic may be necessary within the protocol control unit 177 to minimize any latency penalty due to the decoding and interpretation of the header information. In a data write transaction, the incoming data bytes arrive after the associated header bytes, and it may be necessary to hold the data bytes within the input data buffer unit 178 for a period of time before sending the data on to the target cluster. This may be necessary for synchronization of the I/O write operations with the column select signal 181. Alternatively, the input data buffer unit 178 may be located within the cluster 30. Depending on the implementation, the address and control information may need to be delayed relative to the arrival of the data. In that case, the header may need to be stored in a buffer within the protocol control unit 177 or the cluster 30 for a small number of cycles.

During column burst read transactions, once the header bytes have been predecoded and transferred to the target cluster and bank, the channel is no longer needed to receive any address information since the subsequent burst address information is generated by a burst counter within the cluster. The channel then remains unused until the read data arrives from the target cluster and is sent back across the interface 1 to the master device. For row burst read transactions, it is allowable to transmit a second read header across the channel immediately following the row header either to access another cluster or to load a pending transaction into the same cluster for execution after completion of the current row transaction.

Internal to the master and memory devices, the latches $82_{1-8}$, $92_{1-9}$ operate at the CLKIN, CLKOUT frequency, which would comprise half the external data frequency. Therefore, the internal buses for the memory device would actually be two-bytes wide for each byte-wide channel; one byte would be transferred into the memory device on the rising edge of CLKIN, while a second byte would be transferred into the memory device on the falling edge of CLKIN. The data for both bytes can either propagate on the same edge of CLKIN, or each byte can propagate on a different edge. Due to die size considerations, it may be advantageous to operate the column select circuitry for two bytes at a time, operating at half frequency, repetitively using the same clock edge that transfers the first column address of the burst, which is the falling edge. In that case, both bytes of data would travel in phase throughout the memory device.

Figure 3:
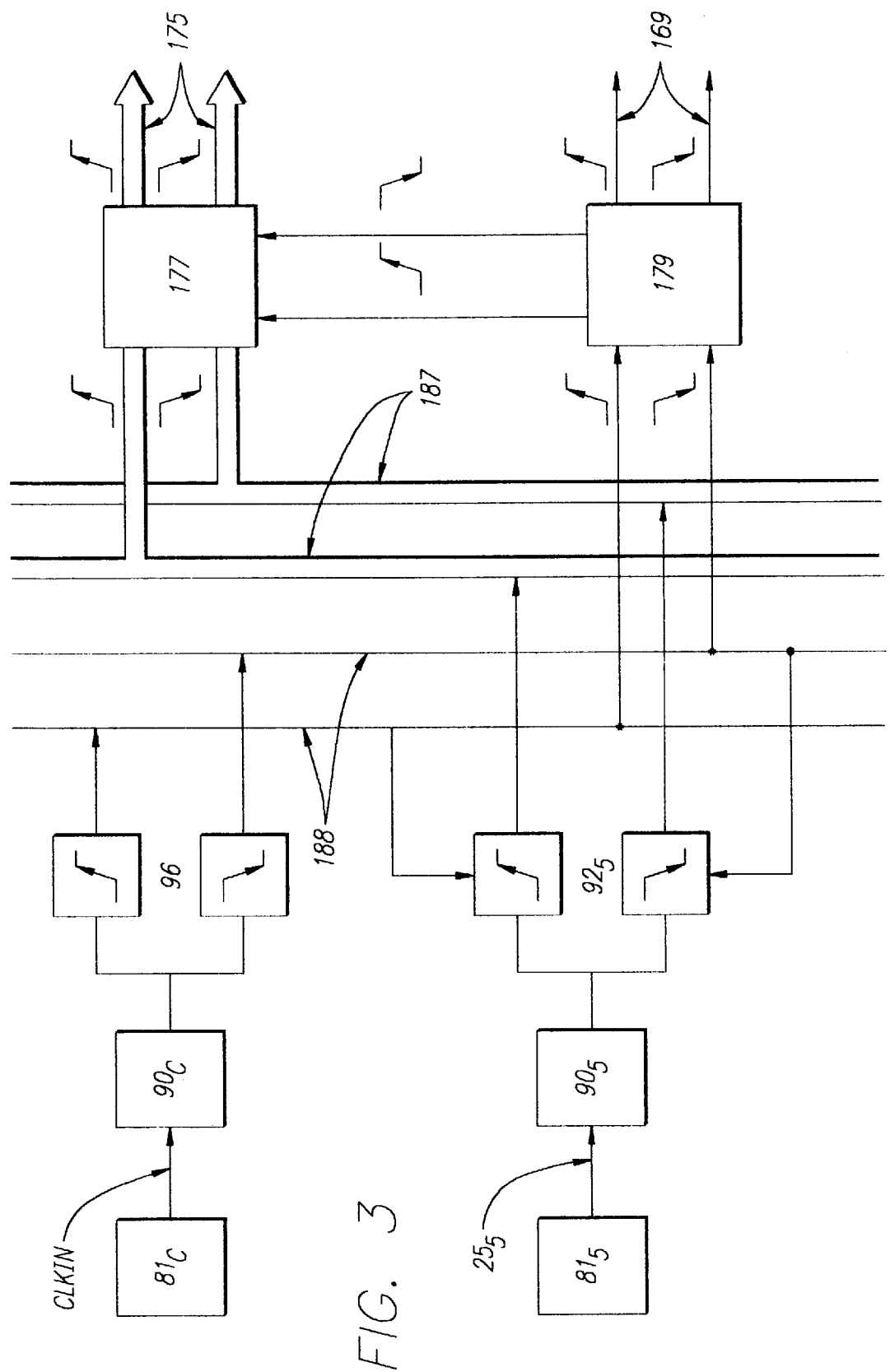
FIG. 3 is a block diagram of an embodiment of a portion of the master and slave port communication architecture of FIGS. 2(A) and 2(B)

FIG. 3 illustrates such a clocking technique for the present application. The data latches $92_{1-9}$ and delay unit 96 of FIG. 2 are illustrated in FIG. 3 as respective pairs of latches and delay unit (for simplicity, only latch pair $92_5$ is shown in FIG. 3, though it should be apparent that each of the latches comprises a similar pair). A first set of the latches samples the incoming data to buffer units $90_{1-9}$ on the rising edge of CLKIN, and the other set samples the incoming data on the falling edge of CLKIN. The more complete representation of FIG. 3 shows the two-byte wide data busses that are transferred into the protocol control unit 177 on opposite edges of the clock. The protocol control unit 177 also drives a two-byte wide bus 175 into the memory device.

Figure 4:
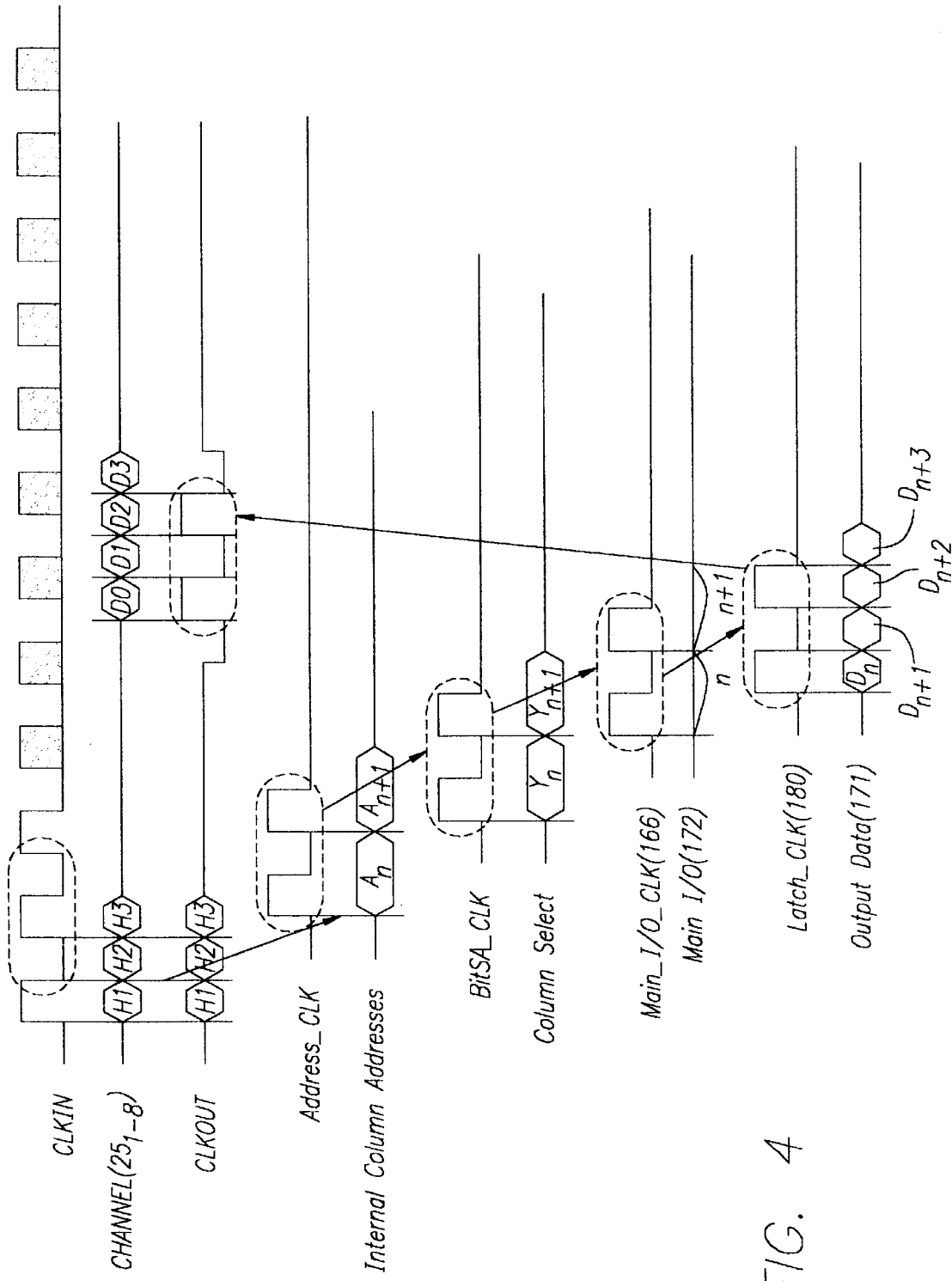
FIG. 4 is a timing diagram illustrating a clock signal propagating through a multichannel memory architecture.

FIG. 4 illustrates the clock propagation within the memory device for an exemplary four-byte long column burst transaction. As will be described below, the clock signal continues to follow slightly behind the data as it propagates through the memory device, whether propagating at full CMOS levels or at small signal levels. In FIG. 4, the four clock edges that propagate through the memory device to generate the four-byte burst are circled in phantom, and the arrows indicate the direction of propagation. Beginning from an unused port, the first header byte (H1–H4) is transmitted across bus $25_{1-8}$, beginning with a rising edge of CLKIN. The CLKIN signal can either be free-running, or can be held low while unused. For example, the first rising edge following a period of being held low can be used to transfer the first byte. No unique start-up cycles are required to initiate the transfer, such as are typical to DLL or PLL-based configurations.

For a column burst access transaction, the column address is transferred during the second byte of the header. Therefore, the particular edge of CLKIN that is used to initiate the column access within the memory device actually comprises the falling edge of the same clock pulse used to initiate transfer of the header. This particular clock edge propagates with the data through several stages until it reaches the target bank, in which the actual column address signals internal to the bank are generated. The first arrow in FIG. 4 indicates the propagation of this falling edge to create the first rising edge of Address_CLK that propagates with the internal column address $A_n$.

The other series of arrows from circled groups of four clock edges indicates the propagation of clock edges necessary to read the four byte burst. Similarly, an eight byte burst would require eight continuous clock edges (or five total clock pulses due to the initial rising edge for the first header byte), a sixteen byte burst would require sixteen edges (or nine total clock pulses), etc. Therefore, it is possible to stop pulsing the CLKIN signal after the required number of pulses to support the burst length have been sent, and additional CLKIN pulses are optional. The shaded CLKIN pulses in FIG. 4 following the first three clock pulses represent optional pulses. For very low power applications, such as hand held devices, it would be particularly desirable to toggle the clocking circuitry as little as possible so as to only send the minimum number of CLKIN pulses. This technique also provides a convenient way to enable and disable the channel. On the other hand, within very high performance systems in which the channel is kept busy with continuous transactions and power savings is less important, it may be preferable to toggle CLKIN continuously so as to simplify the design. Under the protocol definition described below, the unnecessary CLKIN pulses are ignored.

The internal column addresses $A_n$, $A_{n+1}$ are propagated to a column decoder within the memory device (described below with respect to FIGS. 6 and 7) along with a parallel propagating clock signal referred to herein as Address_CLK. In the preferred embodiment, each column address $A_n$, $A_{n+1}$ propagates on a rising edge of Address_CLK. The second column address $A_{n+}$, in a normal burst is generated by a local burst counter coupled to the memory device address buffers within the cluster 30. On the second rising edge of the Address_CLK signal, the address $A_{n+1}$ is acquired from the burst counter rather than the address input, and propagates from that point onward in exactly the same fashion as the first address $A_n$. The burst counter operates at one-half the external data frequency (but equal to the CLKIN frequency), in order to minimize the column address decoding area. This is possible because two bytes are selected for each column access. Single byte reads and writes are accomplished by multiplexing logic elsewhere in the data in and data out paths. Single byte selection could be accomplished by operating the column select circuitry at twice the CLKIN frequency.

Column select signals $Y_n$, $Y_{n+1}$ generated by the column decoder select a set of sixteen bit sense amplifiers to generate small differential signal outputs on sixteen pairs of input/output (I/O) signal lines. The clock signal continues to propagate with the column select signals $Y_n$, $Y_{n+1}$, and now becomes BitSA_CLK. The BitSA_CLK signal is used to control the precharge of these sense amplifier I/O signal lines, as well as to control the operation of a subsequent main sensing stage. This main sensing stage also creates a small signal output n, n+1, shown in FIG. 2(A) as the I/O line output 172, which propagates in parallel with an associated clock Main_I/O_CLK.

The Main_I/O_CLK clock, illustrated at 166 in FIG. 2(A), propagates to a clock buffer 174 to create Latch_CLK signal, shown in FIG. 2(A) as the clock input 180. The Latch_CLK signal 180 latches the I/O line output 172 signal into the read data buffer unit 173 of FIG. 2, and controls the output of the read data buffer unit onto the data bus 171. The read data buffer unit 173 comprises a small buffer to convert the sixteen-bit I/O line output 172 operating at the CLKIN frequency into the eight-bit data bus 171 changing at twice the CLKIN frequency (although note that the actual maximum frequency of the bus lines 171 is equal to the CLKIN frequency, since each rising or falling edge represents a change in the data state).

As data $D_n$, $D_{n+1}$ is supplied from the read data buffer unit 173 into the eight-bit bus 171, the clock buffer 174 simultaneously drives the clock signal 170. The clock signal 170 operates identically, but in the reverse transmission direction, as the clock 68 used for transmission from the master device to the memory device. The clock 170 transmits the data on bus 171 into the buffer units $91_{1-8}$. At the same time, the clock 170 is transmitted through the delay unit 93 to buffer unit $91_C$, providing the CLKOUT signal. CLKOUT is then transmitted across boundary 1 slightly after the data (D0–D3) on bus $25_{1-8}$. The delay unit 93 in the clock path guarantees that the clock is always transmitted across the boundary 1 slightly after the data.

On the master device side of the interface 1, there are nine identical data line buffer units $80_{1-8}$ and $80_C$ which translate the I/O levels across the interface 1 into the internal chip signal swing levels (such as full CMOS levels) which are transmitted to data latches $82_{1-8}$. In the preferred implementation, the data latches $82_{1-8}$ and the delay unit 86 are implemented as pairs of blocks that each operate at one-half the data transfer frequency across the interface 1, in precisely the same manner as data latches $92_{1-8}$ and the delay unit 96 shown in FIGS. 2(A), 2(B) and 3. One set of data latches $82_{1-8}$ samples the incoming data to buffer units $80_{1-8}$ on the rising edge of CLKOUT, while the other samples the incoming data on the falling edge of CLKOUT. The buffer unit $80_C$ takes the slightly delayed CLKOUT signal and the delay unit 86 adds a further small delay in order to absolutely guarantee that the clock 70 arrives at the data latches $82_{1-8}$ after the data has been reliably received.

Once the data has been correctly latched into the data latches $82_{1-8}$, it is propagated into the read data buffer unit 73, which is analogous to the read data buffer unit 178 on the memory device. Since only read data is returned from the memory device to the master device, no logic analogous to the header decoding logic in the protocol control unit 177 in the memory device is required in the read data buffer unit 73. Clock buffer 74 provides buffering and amplification of the clock 70, which is used to propagate the incoming data into the read data buffer unit 73, as well as to synchronize the propagation of data from the read data buffer unit 73 onto the bus 72. In turn, the clock buffer 74 also requires a clock input from the master device control circuitry, which may be the same clock signal 69 used in clocking the synchronization control unit 79. The clock buffer 74 may also provide a separate clock signal 61 to the master device for synchronization with the data. The circuitry for the read data buffer unit 73 and clock buffer 74 is more complex than the write data buffer unit 178 and the synchronization control unit 179, since the data must be synchronized with the clocking environment of the master device, which may be quite different than that of the channel. On the master device side, the multi-line bus 72 can be any width, and can operate at any frequency.

Another synchronization issue is the asynchronous nature of the memory device row and column read access. There is no master clock provided throughout the memory device that is synchronized tightly with the clock on the master device. Rather, the clock is propagated through the data path with the transaction. This makes the transaction efficient in terms of both speed and power, since only the necessary stages are clocked (minimizing power), and no timing margin is needed for each stage of logic relative to a memory device master clock (minimizing latency). The access time is, however, dependent on the length of the row or column access loop, process parameters of the memory device chip, temperature, and power supply voltage. The first two of these factors can be determined during production testing or during a power-up calibration cycle in the system, but the last two can possibly vary during actual operation of the system, depending on the required operating environment and the quality of the power supply circuit.

Therefore, it should be apparent that the access time (latency) may vary in terms of the number of clock cycles on the master device chip. The preferred method of implementation of clock synchronization between the master device and the memory device is to generate a "ready" flag that indicates that the data has been received by the read data buffer unit 73. The master device may elect to begin the transfer of data from the read data buffer unit 73 onto the bus 72 on the next cycle of clock 69 (or some other clock available on the master device) after the assertion of the ready flag. Alternatively, the master device may use a worst-case latency for the memory device which may be derived from the worst case value on the data sheet (which supports the absolute worst combination of process conditions, power supply, and temperature), or a value determined by calibration cycles performed during power up and/or periodically during normal operation of the system.

The generation of the ready flag is intended to be application dependent as well. For applications that require the immediate transfer of the first available byte of data, the ready flag is asserted with the first byte of data, but then the task of synchronizing the subsequent bytes within the burst may become more difficult if the master data frequency is greater than the channel data frequency. In contrast, for example, the master device may prefer that the ready flag be asserted after the complete data burst has been received by the read data buffer unit 73.

The preceding discussion illuminates another fundamental concept of the present application, in that the burden of scheduling and synchronization has been shifted as much as possible from the memory device to the master device. Given the current trends of ASIC software and integrated circuit technology, this is the most cost effective paradigm for conventional DRAM system implementation.

Due to fundamental DRAM architecture limitations, row access transactions cannot support a high frequency burst mode, so the row access circuitry can operate substantially the same as in a conventional DRAM memory device with respect to the actual sensing of the memory cells within the device. The header information for a row access transaction must be translated by the protocol control unit 177 into normal row address and timing signals to support the transaction. After the particular memory cells have been read and amplified to provide adequate differential signal levels on the bit lines, column selection can be initiated.

Figure 24:
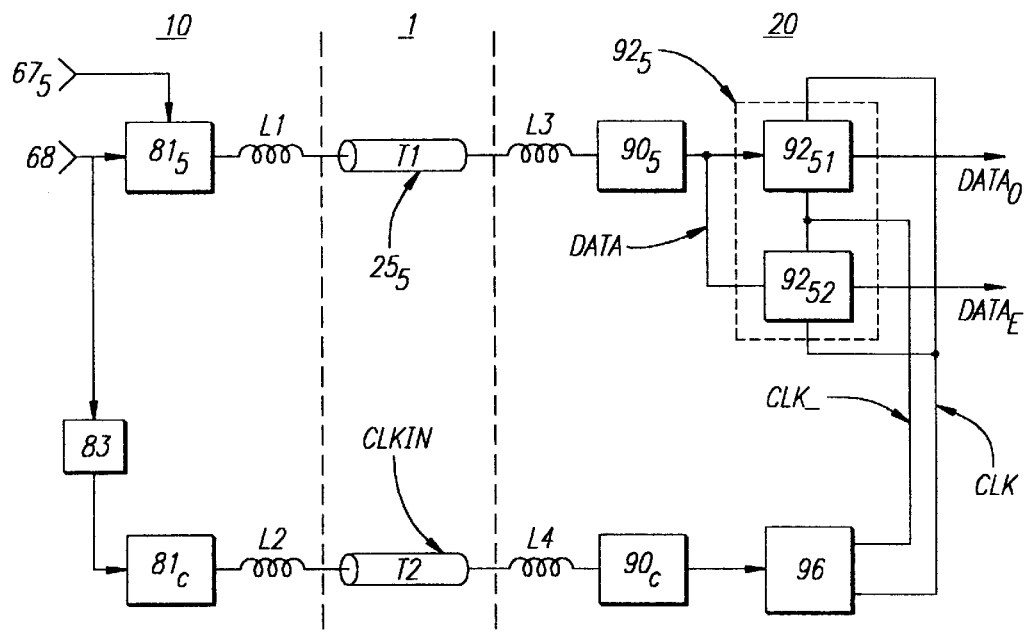
FIG. 24 is a block diagram illustrating the clocking and data path across the interface between the master device and the memory device.
Figure 25:
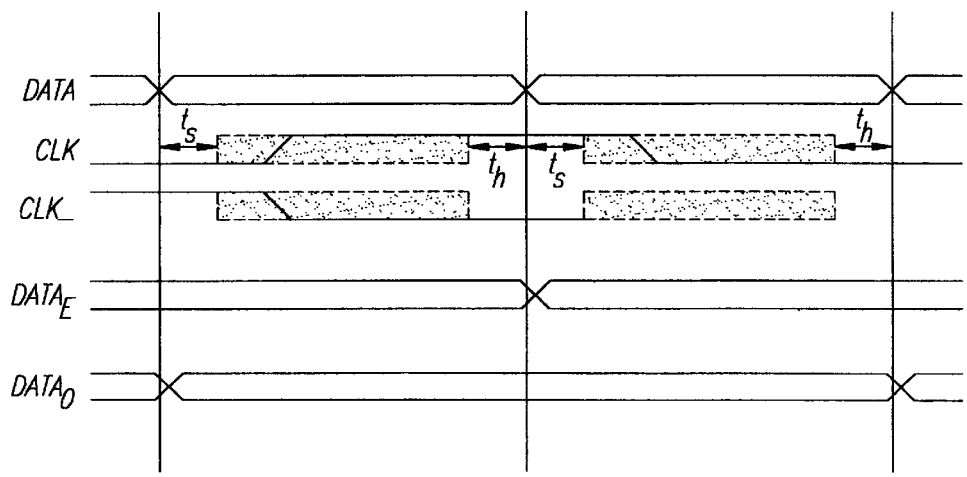
FIG. 25 is a timing diagram illustrating the clocking and data signals of FIG. 24.

As set forth above, clock synchronization of the present application begins with the transfer of the clock 68 on the master side. FIGS. 24 and 25 provide a more detailed rendering of the clocking and data path across interface 1. In the example of FIG. 24, data is to be transferred between the respective buffer units $81_5$ and $90_5$ into the data latch $92_5$, but it should be apparent that this structure is repeated for each of the other seven data bits (including CLKOUT for the ninth bit of header transfers), with one CLKIN circuit controlling all of the data paths. Data latch $92_5$ further comprises a pair of latches $92_{S1}$, $92_{S2}$ that respectively receive delayed and inverted versions of CLKIN, termed CLK and CLK_ from delay unit 96. FIG. 25 illustrates a timing diagram for the various signals of FIG. 24.

Data signals from the bus 67 must be correct and stable in data buffer units $81_{1-9}$ when the transition of clock 68 occurs to initiate the information transfer from the master device to the memory device. Use of delayed versions of the CLKIN signal to synchronize the data throughout the clock and data paths removes any susceptibility of the clock 68 to jitter, since each CLKIN transition is a distinct data transfer event, independent of the overall quality and stability of the original signal from the clock 68.

For each positive and negative transition of the clock 68, a new byte of data is transferred across the interface 1. The critical relationship that must be achieved between the clock path and the eight or nine bit data paths is that CLK and CLK_ must arrive at the latches $92_{S1}$, $92_{S2}$ on the receiver side after the data, but prior to arrival of the data for the next transition. If the clock path is faster than the data path, the previous value of the data will be latched instead of the correct value that is transferred with that particular CLKIN edge. On the other hand, if the clock path contains too much delay, CLKIN will arrive after the next transition of the data, thereby incorrectly latching the subsequent byte of data. This timing relationship of FIG. 25 shows the relatively large acceptable window for the arrival of the CLK and CLK_ signals relative to the arriving data signal.

The transfer of a given byte of data begins with a high or low-going transition on clock 68. This clock signal propagates through data out buffer $81_5$, where it is logically combined with the data on bus segment $67_5$ to provide the output at bus $25_5$. Concurrently, the clock 68 propagates through clock delay unit 83 and clock buffer $81_C$. Clock buffer $81_C$ is designed to be physically identical to data buffer $81_5$, in order to match their respective delays as precisely as possible. The addition of the clock delay unit 83 in the clock path guarantees that the CLKIN signal arrives at the output of $81_C$ slightly after the arrival of the data signal at the output of $81_5$. This delay could be provided by one or two inverters. While longer delay elements are possible, process and operating condition variations may cause the overall delay to be far larger than desired, which would tend to decrease the maximum possible operating frequency of the memory architecture.

Between the data/clock buffers 81 and input receivers 90 are parasitic inductance elements represented by the four inductors L1–L4 and the two parasitic transmission line elements T1, T2. Inductors L1–L4 represent the total package inductance of each of the pins (package lead plus lead frame plus bond wire), and the transmission line elements T1, T2 represent the circuit board traces. With point-to-point connections between ICs, these circuit board trace parasitics are minimized. More importantly, however, the respective magnitudes of the parasitic inductances, capacitances and resistances of the two paths should be matched in order to minimize any delay time skewing between the clock and data paths. Very short distances between ICs provide an inherently small delay time skew between pins, but this method can work for longer distances as well, as long as the L1+T1+L3 path delay is close to the L2+T2+L4 delay.

Similarly, on the slave side, clock buffer $90_C$ is designed to be physically identical to data buffer $90_S$, in order to match the delay through these units as precisely as possible. The addition of the delay unit 96 in the clock path guarantees that the CLK and CLK_ signals arrive at latches $92_{S1}$, $92_{S2}$ with some additional delay after the arrival of data at the respective latches 92. It may also be desirable to increase the delay provided by delay unit 96 in order to center the CLK and CLK_ signals within the time window shown in FIG. 25, as well as to guarantee that the cumulative time delay of delay unit 83 plus delay unit 96 exceeds the total mismatch between the data path and the clock path under all conditions. With reasonably precise control of the delay units 83 and 96 within the clock path, the present clock synchronization method can support extremely high data transfer rates without the use of PLL or DLL clock synchronization circuitry.

The data latch $92_S$ is split into identical data latches $92_{S1}$, and $92_{S2}$, which are enabled and latched on opposite phases of the CLK and CLK_ signals. The data latches $92_{S1}$ and $92_{S2}$ transfer data on opposite phases of the respective clock signals, indicated on FIGS. 24 and 25 as $DATA_O$ (odd) and $DATA_E$ (even), respectively. This is consistent with overall clocking scheme of the present application, where it is preferable to operate the internal chip data bus frequencies at twice the width and one-half the data transfer frequency of the data lines $25_{1-8}$ across boundary 1. It should be apparent that the present clock synchronization method does not preclude the use of a single $92_S$ latch to be operated at twice the frequency, although such an implementation may require a clock doubler with the delay unit 96.

In FIG. 25, the shaded areas indicate the allowable time window for the CLK and CLK_ transitions. For modern integrated circuit technology, the setup ($t_s$,) and hold ($t_h$) times can be extremely small in the typical parameter case (e.g., less than one hundred picoseconds), and considering severe worst case mismatches between the clock and data paths can be less than 300 picoseconds with reasonable design practice. FIG. 25 also includes the $DATA_E$ and $DATA_O$ output waveforms, which transition at one-half the data frequency, to be used internal to the memory device.

FOUR CHANNEL ARCHITECTURE

Referring now to FIG. 5, a system level schematic drawing of a four channel interface between a master device 10 and a multichannel memory device 20 of the present invention is provided. In view of the extreme flexibility of the memory architecture of the present invention, it should be apparent that many substantially different operating modes can be supported. For purposes of describing these different operating modes, the exemplary multichannel memory device 20 supports four channels A–D, and has four memory clusters $30_2$, $30_4$, $30_6$, and $30_8$ containing two banks each, along with four memory clusters $30_1$, $30_3$, $30_5$, and $30_7$ containing only one bank each.

The master device 10 manages data read and write transactions across the interface with the multichannel memory device 20 and includes four channel interface ports $14_{A-D}$. Consistent with FIG. 1, the channel interface ports $14_{A-D}$ couple to respective N-bit wide external buses $25_{A-D}$ capable of carrying either data, address or control information. At the other side of the interface, the memory device 20 has respective channel interface ports $21_{A-D}$ that couple to the other side of the N-bit wide external buses from the channel interface ports $14_{A-D}$ of the master device 10, respectively.

The memory device 20 further includes eight separate memory clusters $30_{1-8}$, though it should be apparent that any number of memory clusters could be advantageously utilized (such as the K memory clusters $30_{1-K}$ of FIG. 1). Each of the memory clusters $30_{1-8}$ includes one or more memory banks 33 comprising a high number of distinct memory locations, such as on the order of 64 KB, with every 8 or 16-bit wide memory location within the memory banks having a unique row and column address. The clusters $30_{1-8}$, further include respective multi-directional signal repeaters $34_{1-8}$ that control the routing of read and write data from the banks 33 to and from the channels.

In the embodiment of FIG. 5, the B and C channel interface ports $21_B$ and $21_C$ are each configured to communicate with half of memory device 20. The interface port $21_B$ communicates with clusters $30_{1-4}$ through internal bus $22_B$, while interface port $21_C$ communicates with clusters $30_{5-8}$ through internal bus $22_C$. Conversely, the A and D channel interface ports $21_A$ and $21_D$ can communicate with the entire memory device 20 by use of multiplexers $24_{1-2}$, and internal buses $22_A$, $22_D$, and $23_{1-2}$. The internal buses allow address information to be transmitted from either of the channels to a desired one of the clusters 30. Similarly, the signal repeaters $34_{1-8}$ are each coupled to the A and D channels through the internal buses $22_B$, $22_C$, and $23_{1-2}$.

There are many possibilities for channel-to-cluster connection configurations within the scope of the present application. The present multichannel, multi-cluster architecture allows lower average read latency as compared with prior art memory architectures, especially when applied to higher density, larger memory arrays. In prior art memory architectures, the latency or read access time for a particular type of access (e.g., RAS access) was specified as the same value for any location within the memory device. When memory devices had fewer memory locations, this requirement did not provide a significant drawback since the difference in access times between the fastest and slowest locations in the memory array were not a significant percentage of overall access time. Memory access time was dominated more by the gate delays of address input and data output paths, rather than resistive or capacitive (RC) delays resulting from the very long signal path length from the address inputs to the memory locations to the data outputs.

For modern high density memory devices, however, the latency for a particular type of read access depends heavily on the overall distance that must be travelled from the address inputs to the particular memory location being accessed to the data outputs. Additional improvements in transistor performance are not expected to effectively reduce this device latency, since the RC delays due to the metallic signal lines are not capable of substantial improvement for various cost and reliability reasons. Moreover, the distances traversed by the signal lines are simply getting much larger. Due to the very large size of present and future memory chips, the latency variation over the whole die can be 50% or more due to these unavoidable RC delays. In the present application, the access delay hierarchy within a single memory device based on channel-to-cluster connection allows lower average latency for accesses to the memory device, when managed with relatively simple scheduling algorithms from the master devices 10 and 15.

Referring again to FIG. 5, notice that the B and C channels each have direct connections to only half the memory array. In contrast, the A and D channels each have the greater flexibility of access to the entire array at the expense of the additional multiplexer 24 stage delays, as well as the additional RC delays of bus segments $22_A$ and $22_D$. Further, these additional delays in the A and D channels are multiplied by two for read accesses back to the same header channel, since the address input path incurs the additional delay as well as the data output path. Therefore, the processor could use channels B and C as the first choice for any read access (i.e., channel B as the primary channel for accesses to clusters $30_{1-4}$ and channel C for accesses to clusters $30_{5-8}$), with the use of either channel A or D for read or write access to a cluster when the primary channel for that cluster is occupied. In this way, channels B and C would be kept occupied by the scheduling logic on the master device 10 for read accesses, with channels A and D used only as necessary, or for operations such as write operations or graphics data transfers that can more easily tolerate increased latency without impacting overall system performance. As a result, the average latency is reduced. For example, if full read utilization of channels B and C were to cover 90% of all read accesses for a particular system, and channels A and D were only needed for the remaining 10%, then the average read access time would be roughly equivalent to the faster read access time of the B and C channels, plus only 10% of the difference between the two significantly different latencies.

FIG. 6 illustrates the internal architecture of an exemplary individual memory cluster 30 in greater detail. As in FIG. 5, the memory cluster 30 receives a multi-line input from each of channels A and B, which correspond to internal buses $23_1$, $22_B$ for clusters $30_{1-4}$, or to internal buses $23_2$, $22_C$ for clusters $30_{5-8}$. Unlike clusters $30_{1-8}$ of FIG. 5, which only contain one or two memory banks each, the exemplary memory cluster 30 in FIG. 6 includes four distinctly addressable memory banks $33_{1-4}$.

The cluster 30 of FIG. 6 includes the control element 31 and the memory banks $33_{1-4}$. The control element 31 processes address information provided across the channels A and B, and includes input ports $32_A$, $32_B$ connected to the channels A, B, respectively, and the multi-directional signal repeater 34. The control element 31 further includes a row select logic unit 38, a column select logic unit 37, and a central bank control logic unit 36. Interconnection between the input ports $32_A$, $32_B$, the row select logic unit 38, the column select logic unit 37, and the central bank control logic unit 36 are described below with respect to FIG. 7. For a given transaction, the row select logic unit 38 receives the row address through one of the input ports $32_A$, $32_B$, the column select logic unit 37 receives the column address through the same input port, and the central bank control logic unit 36 controls operation of the row select logic unit and column select logic unit in relation to the memory banks $33_{1-4}$. In the case of a column transaction, the row address is already latched in the row select logic unit 38 and row decoders $41_{1-4}$, and is therefore not reloaded through the input ports 32. The protocol decoding by the bank control logic unit 36 determines the nature of the transaction and routes the incoming header address bits to either of the column select logic unit 37 or the row select logic unit 38, as appropriate.

As noted above, the memory cluster 30 of FIG. 6 comprises four banks $33_1$ through $33_4$. The banks $33_{1-4}$ each further comprise a single set of bit sense amplifiers $42_{1-4}$, respectively. Each one of the memory banks $33_{1-4}$ includes a high number of distinct memory locations. By way of example, the memory banks may comprise 64 KB organized as 256 or 128 column locations and 256 row locations, with every eight or sixteen-bit wide memory location within each block having a unique row and column address. Each of the memory banks $33_{1-4}$ further includes an associated row decoder $41_{1-4}$ and a column decoder $43_{1-4}$. The row decoders $41_{1-4}$ are connected to the row select logic unit 38 by a multi-line signal 48 that commands the row decoders to enable a desired row. Similarly, the column decoder 43 is connected to the column select logic unit 37 by a multi-line signal 47 that commands the column decoder to enable a desired column.

For a memory bank having 256 byte-wide column locations within a selected row, the 2,048 actual bit lines are connected to 2,048 individual sense amplifiers within the sense amplifier set 42. The column decoders $43_{1-4}$ are respectively coupled to the main amplifiers $44_{1-4}$ that include sixteen distinct amplifier circuits comprising the small signal repeater circuits described subsequently, or some other type of sense amplifier and write driver combination. The column decoders $43_{1-4}$ serve to multiplex the sense amplifiers to the main amplifiers $44_{1-4}$, which are in turn coupled to associated multi-line input/output (I/O) lines $35_{1-4}$. The I/O lines $35_{1-4}$ connect the outputs of the main amplifiers 4414 to the A and B channels through a multi-directional signal repeater 34. The multi-directional signal repeater 34 allows a multi-line signal from either of the channels A or B to be transmitted to any of the I/O lines $35_{1-4}$, and from any of the I/O lines $35_{1-4}$ to either of the channels A or B. In addition, the multi-directional signal repeater 34 boosts the current level on the differential voltage signals that are transmitted from the I/O lines $35_{1-4}$ to the channels A and B, and vice versa.

As known in the art, an individual data signal representing a single unit of information, or data bit, may be transmitted along a single data line of the multi-line bus segments. The voltage of the signal on the data line ranges between $V_{DD}$ and $V_{SS}$, where $V_{DD}$ represents the positive power supply voltage level and $V_{SS}$ represents the ground voltage level. These boundary voltage levels $V_{DD}$ and $V_{SS}$, known as the rail voltages, determine the state of the data bit being transmitted. Alternatively, the data signal can be transmitted along a pair of lines with the data state represented by a differential voltage between the line pair. The differential voltage is a fraction of the full rail voltage, such as 300 millivolts with respect to a typical CMOS 3.3 volt $V_{DD}$ full rail voltage level. The DC bias voltage of the line pair could range between $V_{DD}$ and $V_{SS}$, and many different bias voltage levels have been utilized depending on the particular requirements of the previous circuits. A first data state (such as a data "0") may be represented by a first polarity differential, and a second data state (such as a data "1") represented by an opposite polarity differential. Differential voltage signals are preferred since they require substantially less power than full rail voltage signals, when utilized with the small signal repeater of the parent application. This improved efficiency is a result of the small signal repeater not drawing any DC current, as contrasted with the prior art operational amplifier-type sense amplifiers.

Since the differential voltage signals tend to degrade as they travel over long bus lengths, the signals must pass through periodic repeater stages that boost the current of the signals. The multi-directional signal repeater 34 provides the function of routing the multi-line signals between the A and B channels and the I/O lines $35_{1-4}$, as well as the function of boosting the current of the multi-line signals. The internal operation of the multi-directional signal repeater 34 will be described in greater detail below.

As illustrated in the example of FIG. 6, three distinct row lines $51_{2-4}$ are enabled by the row decoders $41_{2-4}$, respectively. Within the scope of the present application, any number of banks within a cluster may have row lines enabled, from zero up to the full number of banks within the cluster. It should be apparent that a single row line in each of the memory banks $33_{1-4}$ can be simultaneously enabled by respective row decoders $41_{1-4}$. The capacitors within all of the memory cells attached to the row lines $51_{2-4}$ have been read and amplified to full rail signals stored on the sense amplifier sets $42_{2-4}$. In a data read transaction, values latched into the bit sense amplifiers 42 within the selected bank can be transmitted in sixteen bit increments by the main amplifiers $44_{1-4}$ through the associated I/O lines $35_{1-4}$ and the multi-directional signal repeater 34. Conversely, in a data write transaction, sixteen data bits at a time flow from channel A or B through the multi-directional signal repeater 34, to the selected I/O lines 35, to the selected main amplifiers 44, to the selected column decoders 43, to the selected bit sense amplifiers 42, and finally to the respective selected memory cells.

Figure 7:
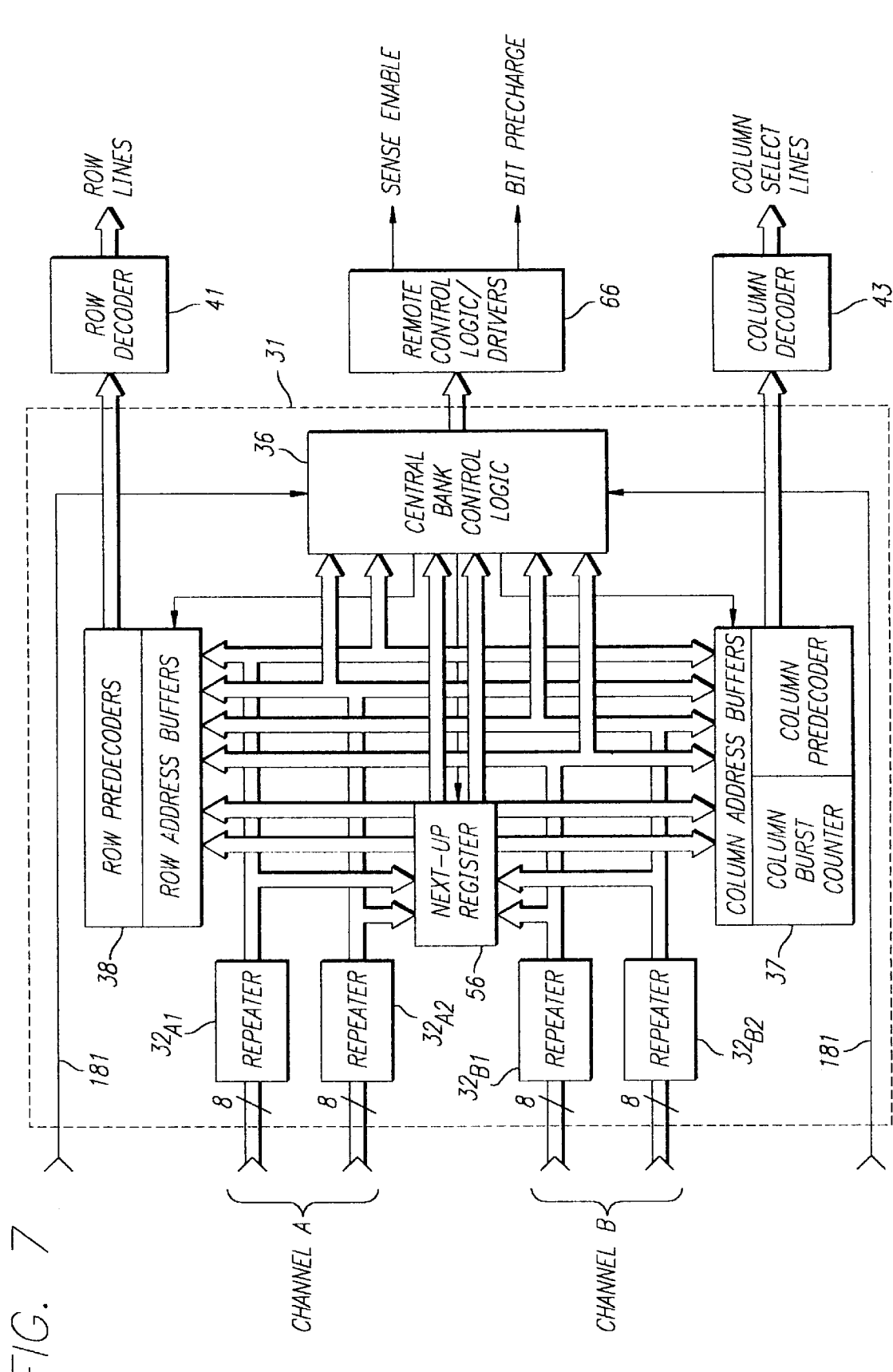
FIG. 7 is a block diagram of a control element within the single memory cluster of FIG. 6.

FIG. 7 shows the address and control portion of control element 31 of the memory bank 30 in greater structural detail. As described above, the control element 31 is connected to multi-line channels A and B which have been routed across the memory device 20 as described above. The sixteen-bit wide buses carrying the A and B channels described above with respect to FIG. 5 are provided to the control element 31 in the form of two pairs of eight-bit input buses, respectively.

The control element 31 includes small signal repeaters $32_{A1-A2}$ and $32_{B1-B2}$ used as address and control information input receivers for each of the respective pairs of channel input buses. The control element also includes a next-up register 56, a central bank control logic unit 36, a row control logic unit 38, and a column control logic unit 37. The small signal repeaters $32_{A1-A2}$ and $32_{B1-B2}$, the next-up register 56, the central bank control logic unit 36, the row control logic unit 38, and the column control logic unit 37 are all coupled to each other through a network of multi-line bus segments. The internal operation of the small signal repeaters $32_{A1-A2}$ and $32_{B1-B2}$ will be described in greater detail below.

The central bank control logic unit 36 controls routing of information within the network of bus segments. Each of the multi-line bus segments are connected to the A and B channels through the small signal repeaters $32_{A1-A2}$ and $32_{B1-B2}$, and are provided as inputs to the central bank control logic unit 36. Control information is provided by the master device 10 to the central bank control logic unit 36 over either of the channels A or B, as well as the column select signals 181 from the protocol control unit 177 in FIG. 2(B). The central bank control logic unit 36 provides control signals to each of the row control logic unit 38, the column control logic unit 37 and the next-up register 56. The row control logic unit 38 and the column control logic unit 37 control routing of row and column address information, respectively.

If the cluster is already occupied with a read or write transaction, the next-up register 56 temporarily stores address and control information until the present transaction is complete, at which time the address and control information is transmitted from the next-up register to the appropriate ones of the central bank control logic unit 36, the row control logic unit 38, and/or the column control logic unit 37 to begin the delayed transaction. Additional detail regarding the functioning of the next-up register 56 will be provided below.

Row or column address information is routed through the small signal repeaters $32_{A1-A2}$ and $32_{B1-B2}$ to an appropriate one of the row control logic unit 38, the column control logic unit 37 or the next-up register 56. In particular, row address information passing through either of the small signal repeaters $32_{A1-A2}$ or $32_{B1-B2}$ is latched into the row address buffers within the row control logic unit 38 after an enabling control signal is provided by the central bank control logic unit 36. Similarly, column address information passing through either of the small signal repeaters $32_{A1-A2}$ or $32_{B1-B2}$ is latched into the column address buffers within the column control logic unit 37 after an enabling control signal is provided by the central bank control logic unit 36. Alternatively, if the channel is busy, the row and/or column address information is automatically latched into the next-up register 56 after an enabling control signal is provided by the central bank control logic unit 36.

The row or column address information latched into the row address buffers and/or the column address buffers is used to access a particular eight or sixteen-bit wide location within one of the banks 33 of the memory cluster 30. The row address information is decoded by a row predecoder within the row control logic unit 38, and is transmitted to a row decoder 41 associated with one of the banks, which selects the desired row lines of the bank. Similarly, the column address information is decoded by a column predecoder within the column control logic unit 37, and is transmitted to a column decoder 43 which selects the desired column lines of the bank.

Once the desired row lines and column lines of the bank are selected, the associated memory cells can be accessed under timing and control of the central bank control logic unit 36. The central bank control logic unit 36 provides a multi-line signal to a remote control logic/driver 66 associated with the selected bank. The remote control logic/driver 66 provides an enable signal to the bit sense amplifiers of the selected row that enables the values stored within the selected memory cells to be read by the bit sense amplifiers. The central bank control logic unit 36 also controls other functions for the remote control logic/driver 66 of the memory cluster 30, such as pre-charging of the bit lines. It may be desirable to put the bit sense amplifiers into a pre-charge state after the particular transaction is completed in order to minimize the row latency during subsequent accesses of different rows on the same bit lines. Otherwise, the data would remain in the bit sense amplifiers, providing a row caching capability and faster column access time into the same row in subsequent read transactions. It should be apparent that the architecture can further support other types of control functions by pre-programming the remote control logic/driver 66 to respond to unique commands from the central bank control logic unit 36, depending upon user requirements.

The column control logic unit 37 further includes a column burst counter that allows the memory cluster 30 to process burst transactions. In a burst transaction, sequential bytes of data are accessed by use of a starting column and row address and a burst length. The column burst counter provides the next address to the column predecoder for each new cycle in the burst (either in binary or interleaved count sequence, as described below), without requiring the address to be provided from the ports 21.

Within the central bank control logic unit 36, there is an additional counter that is loaded with the transaction burst length and keeps track of how many burst cycles remain to complete the transaction. This burst length counter (as opposed to the burst counter coupled to the column address buffers) allows the data to keep flowing until the desired burst length is reached. When the end of a burst is reached, the burst length counter produces a flag signal, which can be used to initiate the transaction from the next-up register 56, if loaded, or a precharge operation if called for from the current transaction. It may be possible to re-use the same counter circuit to implement the same function for the pipelined random column mode, with minor modification.

Once the burst transaction is completed, and no further transactions are pending in the next-up register 56, the cluster is returned to the "ready" state, in which it can accept a new transaction from any input channel connected to the cluster. Note that the master device must keep track of the order of transaction arrival at the cluster. It is anticipated that the cluster will processes transactions in the order received; however, it would be possible to process multiple transaction headers that arrive at nearly the same time from different ports by providing arbitration logic and/or appropriate modification to the protocol definition. The read data sent to the ports by the cluster has no header, and therefore cannot be identified with the transaction header it originated from. Therefore, without arbitration definition in the protocol, the master device must maintain sufficient space between transactions to the same cluster to guarantee the order of arrival of the transactions at the cluster inputs 32.

TRANSACTION TYPES AND PROTOCOL

The multichannel, multibank architecture can support several distinctly different types of transaction. The A, B, C and D channels of FIG. 5 can be utilized either independently or cooperatively to conduct data read and write transactions between the master device 10 and any of the memory clusters 30 within the memory device 20. In the independent mode of operation, as many as all the channels can each simultaneously be used to conduct read and/or write transactions of any length within separate ones of the memory banks 30, without any special timing requirements or relationship between activity on the separate channels. For example, numerous transactions across channel A can occur while a long single transaction is occurring across channel B, and vice versa. In the cooperative mode of operation, two of the channels can work together to conduct a single read or write transaction of any length within one of the memory banks.

The architecture of the present application can support various types of transactions, including a row burst access, a column burst access, a background row change, a pipelined random column access, and refresh operations. In a row burst access transaction, a single row is selected by latching the contents of the memory cell locations of the row onto the bit sense amplifiers. More than one sequential eight or sixteen-bit column location within the selected row are accessed, with the transaction initiated by use of a starting address and a burst length. A column burst access transaction is an abbreviated version of the row access transaction in which the row address was provided in a previous transaction. Column read access transactions can have substantially lower latency since the differential bit sense amplifiers have already latched the row memory cell data on a previous transaction. Once the first byte of a burst read access transaction appears at the output, the burst frequency for subsequent data of the burst is the same for both row and column burst read transactions. A background row change can support a column access transaction by selecting a particular row, and loading data from the memory cell capacitors of the row into the bit sense amplifiers which latch the data. Unlike a row burst read access transaction, the data is not read onto any of the channels during a background row change, but is held by the sense amplifiers until a subsequent transaction is initiated, such as a column burst access transaction. Refresh operations are background row changes that are controlled by a refresh counter located in each cluster.

The pipelined random column access mode contrasts with normal row or column burst accesses which only provide sequential or interleaved internal addresses for each consecutive operation from the burst counter. Instead, a new column address can be provided across interface 1 every cycle for a pipelined random read operation, which can be located anywhere on the selected row. Data from each new random column address is provided to the master device consecutively on a different channel at the same frequency as the address inputs, delayed by the column access time from the corresponding address inputs. Any column address within the selected row can also be written to every other cycle, with alternating data and column address information provided in a unique packet format. Thus, the transaction frequency of a pipelined random column write access is one-half the frequency of either a pipelined random column read access or conventional column burst transaction. It is also possible to define the random column write mode to send two or more bytes of data for each new byte-wide column address.

For a given type of transaction, the particular operating mode of the selected channel and cluster of the memory device 20 is defined by the protocol by which information packets are configured. According to the protocol, each transaction is initiated by a header that includes certain address and control information regarding the routing of data. In a data write transaction, the header will be followed on the particular channel by data to be written into one of the memory banks 33. Alternatively, write data could be provided after some delay on the same channel, or from a different channel, by appropriate modification of the protocol definition.

Referring now to FIGS. 8 through 12, exemplary header formats for various types of read and write transactions are illustrated, including a row burst access (FIG. 8), a background row change (FIG. 9), a column burst access (FIG. 10), a pipelined random column mode (FIG. 11), and a pair of pipelined random column write address/data packets (FIG. 12). Each of the exemplary header formats include a plurality of nine bit words provided in sequential cycles of the external bus clock. With respect to the memory device 20 of FIG. 3, the nine bits are provided by the eight data bits of the respective channels A–D termed herein as CHANNEL [0:7], which corresponds to the bus $25_{1-4}$ on FIGS. 2(A) and 2(B) multiplexed together with the CLKOUT signal associated with a respective one of the channels. As known in the art, the notation "Signal[i:j]" refers to a specific range of signals or lines. For example CHANNEL[0:7] refers to CHANNEL0, CHANNEL1, . . . CHANNEL7.

In the header descriptions that follow, it should be apparent that the specific formats are for exemplary purposes only, and that alternative formats are possible. These header formats represent the minimum types of information that are necessary to conduct the various read/write transactions across the channels, but that specific hardware configurations may require the headers to include additional address bits or other types of information. Further, it should be apparent that the exemplary header formats are intended to describe the nature of the transactions supported by the architecture described above. The bit width of each of the header "words," the number of header words, and/or the ordering of information within the header words is not meant to be restricted by the following description.

In this invention, it is possible to use the CLKOUT bits associated with channels A–D of FIG. 5 for information input to the memory device 20, since these bits are not used when information packets are being transmitted across the respective channels from the master device 10 to the memory device. They are used to synchronize read data transmitted across the interface from the memory device 20 to the master device 10, which cannot occur during transmission of the header information or write data to the memory device. Moreover, this use of the CLKOUT ports is further desirable since it would conserve at least one pin on the device. It should also be apparent, however, that the additional bit of information could also be provided by increasing the external bus width to nine bits or greater, though that would necessarily add additional pins to the device and would be inconsistent with the stated objective of minimizing the number of pins on an IC package.

FIG. 8 illustrates the header format for a standard row burst access read or write transaction, and includes four sequential nine bit words. The first word is transmitted during clock cycle one, and includes a three bit field containing CLUSTER[0:2], a two bit field containing BANK[0:1], a single bit field containing REFRESH, a single bit field containing PIPELINE, a single bit field containing DIRECT_ACCESS, and a single bit field containing HIT/MISS. The first word is utilized to identify where the transaction is going to take place, and what type of transaction it will be. By providing this information first, device latency can be minimized. As will be understood from the description that follows, the first word format is identical for all transaction types. Depending on the transaction type specified in the first word, the meaning and format of the subsequent words can be radically different for each of the different transaction types.

The transaction location is defined by the CLUSTER[0:2] and BANK[0:1] fields. In particular, the CLUSTER[0:2] and BANK[0:1] fields specify the cluster and bank location of the desired transaction. As described above, the embodiment of FIG. 5 includes eight memory clusters 30 within the memory device 20, with four of the clusters having two banks each, and the other four cluster having one bank each. The header format of FIG. 8 could support up to eight clusters with four banks per cluster. For smaller numbers of clusters and banks, the extra bits are unused and ignored. It should be apparent that a greater number of clusters and/or banks can be supported within a memory IC or embedded memory structure by use of more bits dedicated for cluster and bank addressing within the first or subsequent words of the header.

The transaction type is defined by the REFRESH, DIRECT_ACCESS, HIT/MISS and PIPELINE fields. The REFRESH field specifies whether or not the particular transaction is intended to initiate a sequence of operations to restore the DRAM memory cells to full levels, without providing external data to or from the memory cells to be refreshed. As known in the art, DRAMs store charge on a capacitor and must be periodically refreshed to insure that data remains intact. The memory architecture of the present application can support any of the standard DRAM refresh modes by implementing specific codes in the refresh protocol header.

A refresh operation is indicated by enabling the REFRESH field in the first header word. If this field is enabled, no column or row addresses are necessary since the refresh row addresses are provided by a refresh counter located in each bank. Alternatively, a refresh operation in which the master device provides the addresses can be implemented using a background row change header (described below with respect to FIG. 9). The refresh counter allows each cluster to implement refresh operations in the background within unused clusters while the channels are in use with read and write transactions with other clusters. Thus, the channels can be efficiently used for transferring data, without losing bandwidth to refresh operations (except for transmitting the occasional refresh header). Conventional DRAMs lose approximately 1–2% of the available bandwidth to refresh overhead.

Since row and column addresses are not required, the refresh transaction header requires only one additional word after the first word, which can provide $2^9$ different combinations of information. For example, the additional refresh header word can include information regarding the number of rows to be refreshed with the current refresh transaction (possibly re-using the same burst count decoding circuitry, and increasing the row count number with some of the unused burst count codes). Also, additional clusters could be refreshed at the same time by encoding the number of contiguous clusters to be refreshed in the header word. The header word can also specify self-refresh, in which the refresh operation is completely controlled by on-chip circuitry common to conventional DRAMs. This common refresh circuitry can be shared amongst multiple clusters.

The DIRECT_ACCESS field specifies whether the particular transaction is to be a row/column access to or from the communication ports 21, or whether the transaction is intended to be a background row change with no data immediately provided to or from the newly accessed memory cells. For a background row change, the data is read from the selected bit lines to the bit sense amplifiers, so that a subsequent operation can take place with faster column latency. This differs from a refresh operation in the sense that single row addresses are provided in the transaction header with no involvement of the refresh counter. The background row change operation will be described in greater detail below with respect to FIG. 9. Finally, the HIT/MISS field specifies whether the transaction is a row or a column access. A hit refers to a column access and a miss refers to a row access. Based on the value of the HIT/MISS bit, the subsequent word of header information will contain either row or column address information.

In the case of a column access, the row address bits are unnecessary, since the row is already enabled and the data from all the memory cells within that row are latched into the bit sense amplifiers. Any DRAM architecture, including the present application, requires a master device to keep track of the selected rows in order for the system to take advantage of the substantially faster DRAM column access time. Enabling of the PIPELINE bit within the first header word changes the meaning of the second header word to provide information about the length and nature of the pipelined random burst transaction (see discussion with respect to FIGS. 11 and 12 below).

The second and third nine-bit words for the row access read or write transaction header provide the row and column addresses for the transaction. The second word is transmitted during clock cycle two, and includes a nine-bit field containing the ROW[0:8] field. The ROW[0:8] field specifies the exact row address within the desired cluster and bank specified in the first word. Nine row address bits allow access to 512 ($2^9$) rows within a particular bank. For alternative memory definitions requiring fewer row address bits, certain bits can remain unused and ignored. The third word is transmitted during clock cycle three, and includes a seven-bit field containing COLUMN[0:6]. The COLUMN [0:6] field specifies the exact column address within the desired bank and sub-bank specified in the first word. In this embodiment of the present invention, the eight-bit ROW field and seven-bit COLUMN field are illustrated as sufficient to address every byte of data stored within a particular sub-bank, but that it should be apparent that larger sized memory address spaces may require larger channel widths and/or more words in the header depending on user requirements.

The third nine-bit word further includes two additional single-bit fields that are necessary to define the transaction, including COUNT_SEQUENCE and R/W. The COUNT_SEQUENCE field specifies the type of burst count to be utilized in a burst transaction and will be described in greater detail below with respect to the fourth nine-bit word of the row access header. The R/W field specifies whether the transaction is intended to be a data read or write transaction. In the preferred embodiment, this field enables the data input circuitry on the same channel to sample the data inputs for the number of clock cycles specified by the burst count directly after application of the header.

The fourth nine-bit word is transmitted during clock cycle four, and also include fields necessary to define the transaction, including a one-bit HIGH/LOW field, a four-bit BURST_LENGTH[0:3] field, a two-bit DATA_CHANNEL[0:1] field, and a one-bit PRECHARGE field. The BURST_LENGTH[0:3] field encodes the length of a data burst. The burst counter within the column select control unit 37 of FIG. 4 advances sequentially every CLKIN cycle to provide a new address to the column predecoders. The burst counter continues to advance until the burst length defined in the BURST_LENGTH[0:3] field is reached, as determined by the burst length counter within the central bank control logic unit 36. The BURST_LENGTH[0:3]field can be encoded to define up to sixteen different values for the length of the data burst. An example of BURST_LENGTH[0:3]field encoding is shown in Table 1.

TABLE 1

| Encoded Burst Length (bytes) | BURST_LENGTH[0:3] |
| --- | --- |
| 1 | 0000 |
| 2 | 0001 |
| 4 | 0010 |
| 8 | 0011 |
| 9 | 0100 |
| 16 | 0101 |
| 32 | 0110 |
| 64 | 0111 |
| 128 | 1000 |
| 256 | 1001 |

The COUNT_SEQUENCE field described above specifies the manner in which the burst counter operates. As known in the art, there are two types of burst counts: a binary count and an interleaved count. It may be advantageous to specify the type of burst count on a transaction-by-transaction basis. For example, a first burst transaction may support a graphics application that requires the binary type burst count, while a second burst transaction may support a microprocessor demand that requires the interleaved type burst count. It should be apparent that both of these transaction types could be occurring simultaneously across separate channels.

The HIGH/LOW field specifies whether the high or low byte is desired. During a read transaction of a single byte of data, the row and column address information would internally select two adjacent bytes, due to the sixteen-bit wide internal data path. The HIGH/LOW field determines which of the two bytes will be externally accessed. Alternatively, it may be desirable from a die size perspective to always select two or more bytes as a minimum read unit size from a bank, eliminating the need for the HIGH/LOW field. In the case of a two byte minimum read, it would be possible to access two bytes and allow the master device 10 to simply disregard the non-requested byte.

The DATA_CHANNEL[0:1] field specifies whether the data read from the memory bank 33 is to be provided on the same channel as the one on which the header was provided, or on a different channel that is also connected to the accessed bank. Essentially, the memory device 20 is operating in an independent mode when the read data is routed to the master device 10 on the same channel as the received header, and is operating in a cooperative mode when the data is routed to the master device 10 on a different channel. The two bits of the DATA_CHANNEL[0:1] field allows selection of one of up to four channels for routing the data to the master device 10.

The PRECHARGE field specifies whether the bit lines should be pre-charged after the transaction is completed. It is desirable to be able to decide on a transaction-by-transaction basis whether to immediately put the bit lines back into precharge after the transaction is done in order to minimize the row latency during the next access of a different row on the same bit lines. Otherwise, the data would remain in the sense amplifiers, providing faster column access time into the same row in subsequent read transactions. In this respect the bit sense amplifiers are used as a cache, allowing faster access to data in the row. Since the architecture of the present invention permits multiple banks within the same cluster to be simultaneously accessed, a greater number of independent rows can be available at the same time to provide a larger cache capability. For example, the embodiment of FIG. 5 provides twelve possible rows that can be used in this manner, providing a 3 KB secondary cache capability.

FIG. 9 illustrates the header format for a background row change transaction, and includes two sequential nine-bit words. The two nine-bit words are essentially identical to the first two words of the row access header, with the DIRECT_ACCESS field toggled to the opposite state, indicating that the transaction is a background row change transaction. In a background row change, the data is not read onto the channels and no column address is necessary. Accordingly, the third and fourth nine-bit words of the row access header are not required. By definition, a background row change will not precharge after completion of the transaction.

FIG. 10 illustrates the header format for a column access transaction, and includes three sequential nine-bit words. The three nine-bit words are essentially identical to the first, third and fourth words of the row access header, with the HIT/MISS field toggled to the hit state, indicating that the transaction is a column access transaction. During a column access, the row line has been previously specified, such as by a previous row access in which the bit lines were not pre-charged subsequent to the transaction, or by a previous background row change transaction, and it is redundant to send the same row address again. Moving the column address from the third header word to the second header word allows the data to be accessed with minimum latency.

Another type of operation that is optimally supported by the pipelined, flow-through architecture of the present invention is referred to as the pipelined random column read or write mode. In this mode, a new column address located anywhere within a selected row is provided across interface 1 for each byte or number of bytes that is read or written within the transaction. This contrasts with a typical column burst transaction, in which new column addresses are provided either sequentially or in interleaved form from the burst counter within the column select unit 37, starting with an initial address provided in the header.

This mode is entered by use of the special header configurations of FIGS. 11 and 12. FIG. 11 illustrates the header format to initiate a pipelined random column read or write transaction, and includes two sequential nine-bit words. The first word is the same as for other types of transactions, but with the PIPELINE bit enabled, which changes the meaning of the second and subsequent words provided across the channel.

The second word is transmitted during clock cycle two, and includes a four-bit field containing the TRANS_LENGTH[0:3] field, one-bit PRECHARGE and R/W fields, a two-bit DATA_CHANNEL[0:1] field and a one-bit COLUMN(MSB) field. The TRANS_LENGTH[0:3] field is similar in encoding to the BURST_LENGTH[0:3] field described above; however the TRANS_LENGTH[0:3] specifies how many subsequent column address bytes will be provided across the channel within the transaction. The PRECHARGE and R/W fields have the same meaning as described above with respect to column burst access transactions.

The DATA_CHANNEL[0:1] is also the same as described above, though it has greater importance in supporting the pipelined random column read mode. The DATA_CHANNEL[0:1] field is necessary to specify an alternative target channel for providing data of a pipelined random read transaction, since the header channel is busy providing the new column addresses at the maximum data frequency. In a conventional column burst transaction, the column addresses are provided by the burst counter, so the header channel is free to provide the read data. Finally, the COLUMN(MSB) field specifies the most significant bit of a column address, and allows this mode to support column addresses that are too large by one bit to address within a single header word. The read address format is not shown, since it is simply a repeating series of column addresses provided every half-cycle starting immediately after the header. The data appears on the target port at the input address frequency, delayed by the column latency.

In a pipelined random column write transaction, the header is followed on the same channel by packets containing the column addresses and data, in the format illustrated in FIG. 9. In one particular embodiment, the column addresses are provided every other word, and alternate with data to be written at the specified column address. Accordingly, the frequency of the write transaction is one half the maximum frequency of the channel, since the channel is shared by addresses and data. Some alternate combinations of address and input data are described subsequently. The HIGH/LOW field is provided for memory architectures that internally access sixteen bits at a time, and allow the high or low byte location to be specified for writing each data byte.

These operating modes are illustrated by timing diagrams within FIGS. 13–23. As described previously, clock synchronization is achieved by the transmission of the CLKIN (clock to memory device) signal along with the header bytes from the master to the memory device, while read data from the memory device to the master is synchronized with CLKOUT (clock from memory device), which is a delayed version of CLKIN. During transmission of the header, for all types of operations, the CLKOUT signal line is used to transfer one bit of the header to the memory device, increasing the header width to nine bits. For larger address spaces contemplated for the future, the width of the channel can grow by one bit at a time with a well-specified address extension paradigm, in which the additional bits can comprise portions of row or column addresses. Alternatively, the channel width may jump to sixteen bits with appropriate modification of the header protocol.

Figure 13:
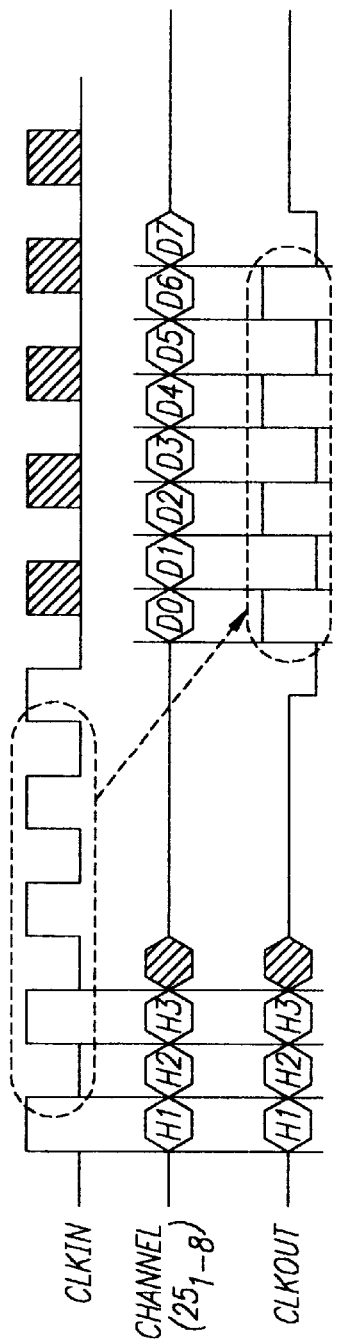
FIG. 13 is a timing diagram illustrating the operation of a simple column burst read transaction.

In FIG. 13, the operation of a simple column burst read transaction is shown. As described above, a column burst read transaction comprises a read access to a location within a selected row, equivalent to a CAS-type access for a normal DRAM, followed by some number of bytes located in contiguous address locations relative to the location of the starting byte. The address count sequence of the burst can be either a linear count, or a so-called interleaved count within the present application. For a column burst read operation, there are only three header bytes required to completely specify the transaction. The second byte of a four-byte row transaction header contains the row address information; however, for a column access, this second byte is redundant and is not sent, allowing the third and fourth header bytes to advance by one-half clock cycle, saving one-half clock cycle of latency. The master device is required to keep track of the enabled rows, in order to know that a column access transaction can be implemented, as is true for any conventional DRAM architecture. This does not require the master device to generate any new information, since it initiated the previous transaction to the enabled row, and did not precharge the row at the end of the previous transaction. The master device must, however, provide for storage of this information and must check the status of all selected rows for each new transaction before a column access transaction can be initiated. Thus, no "handshaking" is required from the memory device to indicate to the master device the status of the selected rows.

After three header bytes have been transmitted to the memory device, the associated port 21 is considered to be busy until the transaction has been completed. Alternatively, a second header word could be inserted after a column header, by including additional logic and modified protocol definition. The memory device ignores the state of the inputs until the port 21 becomes available after the transaction has been completed. Internal to the memory device, the path travelled by the address and control information continues to be synchronized by delayed versions of the CLKIN signal, as described above with respect to the FIG. 4. For the eight-byte read transaction shown in FIG. 13, eight CLKIN edges are required (or five total clock pulses), beginning with the first falling edge of CLKIN. After the fifth clock pulse, the CLKIN signal can continue to provide clock pulses, or can be simply held low in order to save power. Read data bursts always comprise an even number of bytes, due to the minimum selection of two bytes by the internal column access architecture of the memory bank, except that single byte reads can also be supported by the use of multiplexing logic techniques in the data output path. In that case, the minimum two-byte increment would be selected by the column select logic unit 37. The column address least significant bit would route the selected byte of the two bytes arriving at the output data buffer unit 173 from bus 172 directly to bus 171. The unselected byte would not be transferred to the output data buffer unit 173.

Figure 14:
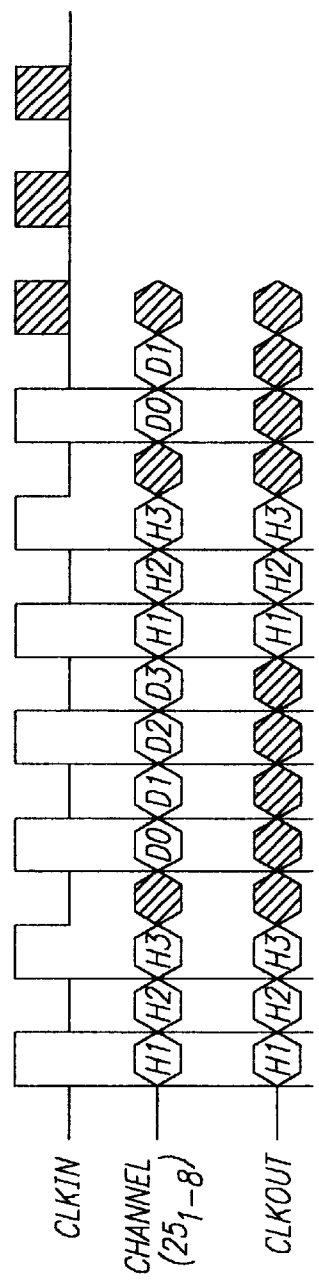
FIG. 14 is a timing diagram illustrating a pair of simple column burst write transactions.

FIG. 14 shows a pair of simple column burst write transactions. The first transaction begins with the three-byte column burst header, which looks the same as the header for a column read burst, with the only difference being the state of the R/W bit of the third header byte. Data starts to be transmitted into the memory device on the first rising edge of CLKIN following the header. The input signals are ignored by the memory device for the unused half-cycle between the header bytes and the data bytes. Alternatively, the first data byte could be provided on the next half cycle following the last header word.

Write data bursts are always an even number of bytes in the preferred embodiment, due to the minimum selection of two bytes by the internal architecture of the memory bank, with the exception of single byte writes. In the case of single byte writes, the data write drivers for the unwritten byte must be disabled by the column address least significant bit. The next header (which can be of any type, although another column write burst is shown for exemplary purposes in FIG. 14) can begin on the next rising edge of CLKIN following the last data byte written into the memory device. For the example shown, there is no gap between the last data byte of the first transaction and the first header word of the second transaction, which is a two-byte column write transaction. Additional CLKIN pulses may be required following the last data byte in order to allow a delay in the write data path sufficient to match properly with the corresponding column select signals.

Figure 15:
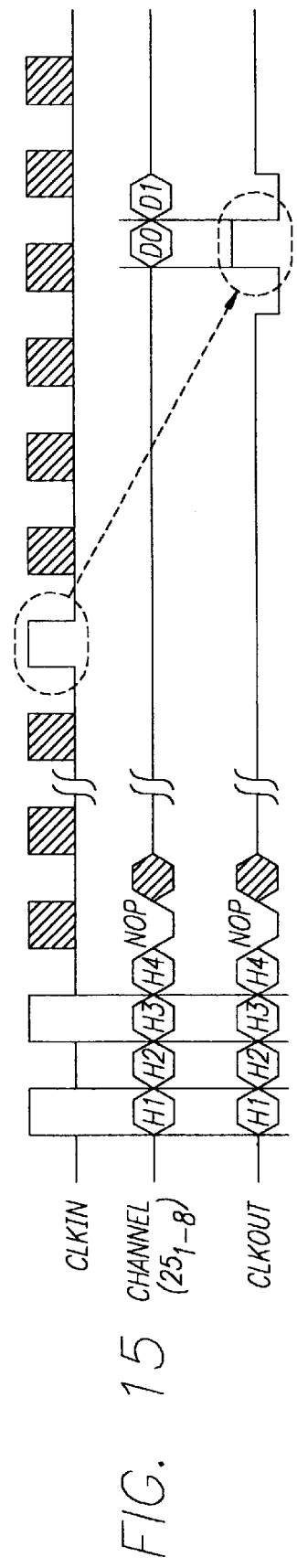
FIG. 15 is a timing diagram illustrating a two-byte row burst read transaction.

FIG. 15 shows a two-byte row burst read transaction. The four-byte row access header is clocked into the memory device by two clock pulses of CLKIN, after which the CLKIN signal can stop (or continue to pulse) until the internal row access sequence has progressed to where the internal column select signal can be enabled. At that point, there needs to be at least the same number of CLKIN pulse edges as the burst count specified in the header. The access latency from these subsequent CLKIN pulses is roughly the same as that of a column access time. The read data is synchronized at the output by CLKOUT, which is derived from the subsequent CLKIN pulse or pulses, rather than the header CLKIN edges, as shown in FIG. 15. Since it is possible to provide a second transaction header immediately following a row access header (see subsequent detailed discussions for FIGS. 18 and 19), a NOP (i.e., no operation) command may be required as shown when a second header is not supplied, in order to temporarily disable the protocol control unit 177.

There are two latency variations to the row burst read transaction, depending on the initial state of the memory bank. If the memory bank is in a precharged state before the header is applied, then the access time for the read is in the range of a conventional DRAM row access, which is between 45–60 ns for current DRAM technology. If a different row within the bank is in the enabled state when the transaction starts, (i.e., bit sense amplifiers are storing data and available for a faster column access), then a precharge operation is necessary at the beginning of the subsequent row burst read transaction. The header does not need to specify this, since the memory device automatically performs the precharge if necessary; however, the latency of the read access may be 20–30 ns longer to include this precharge operation at the beginning of the operation.

Figure 16:
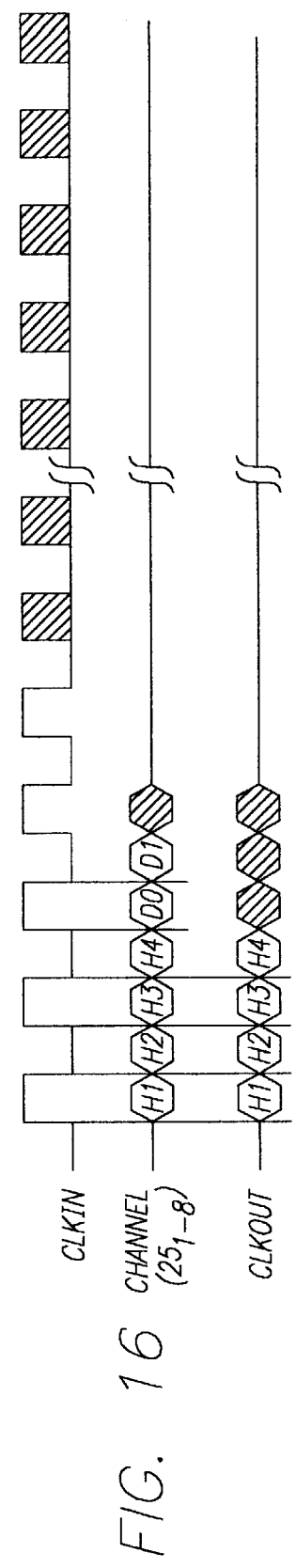
FIG. 16 is a timing diagram illustrating a two-byte row burst write transaction into a precharged memory bank.

FIG. 16 shows a two-byte row burst write transaction into a precharged memory bank. If the bank is not precharged, a row within the bank is enabled and a precharge operation is required before the row can be selected. In that case, if the data is to be supplied immediately following the header, a fairly deep buffer on the memory device may be required to store all the write data until the precharge has been completed and the write burst can commence. Therefore, within the preferred embodiment of the present application, for row write transactions to non-precharged banks, a background row activation or row access cycle must be performed first, then a column burst write transaction can perform the write operation. Alternatively, any previous transaction that leaves the bank in a precharged state can be followed by a row burst write to the precharged bank, as shown in FIG. 16.

As illustrated in FIG. 16, the write data may be able to follow immediately after the header, as in a column burst write transaction. This is possible because the bit sense amplifiers can be written prior to the full selection of the row line to transfer the newly written data back to the memory cell. Therefore, the timing relationship between the write data and the column select signals may be the same as for a column burst write transaction. An additional delay between the header bytes and the write data bytes may be necessary in the row write case to allow the bit sense amplifiers to become fully ready for the write operation, but this is not due to the row selection. Additional CLKIN pulses may be required after the last data byte in order to allow a delay in the write data path to match properly with the correct column select signals. The timing diagram of FIG. 16 shows a long series of optional CLKIN pulses after the data has been written into the memory device. This is meant to convey that the cycle time for the row write operation may be longer than for a column write operation, due to the inherently slow selection of the row lines in conventional DRAM technology.

In the preferred embodiment, all write transactions are constrained to occur completely on one port, and further that the data follows immediately after the header (or within a precisely specified small number of cycles) for very simple synchronization of data and addresses. Similarly, it would also be possible to allow data to be provided on a different port or delayed on the same port with a corresponding increase to the protocol complexity and synchronization precision. For row or column read transactions to a particular bank, however, any port connected to the bank can function as the address and control input source for itself or for any other port connected to the target bank. As described previously, the header protocol includes a bit field to specify the destination port for any read transaction. In normal burst transactions, the data appears back on the same port that supplied the header information, but the header can also redirect the read data onto a different port connected to the same bank.

Figure 17:
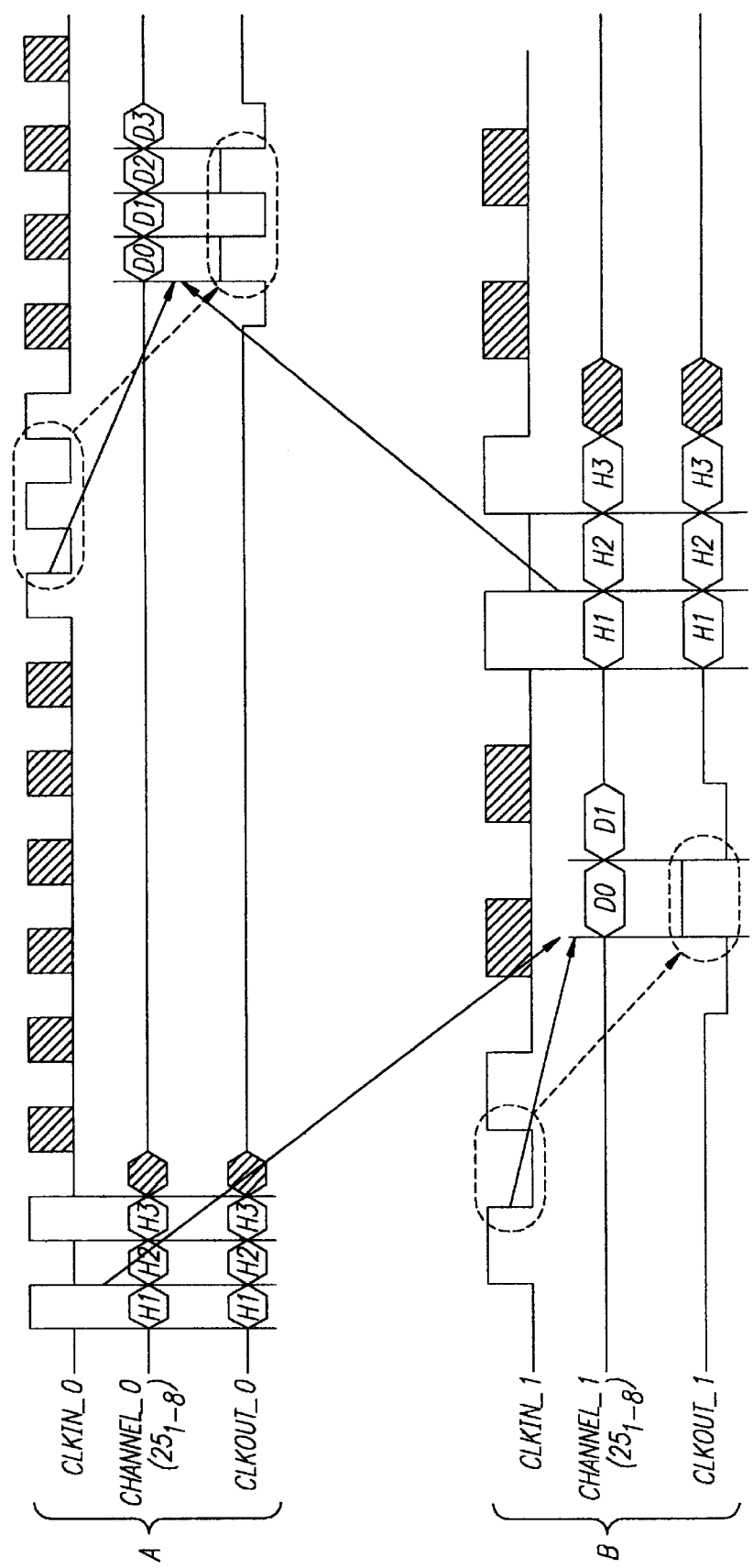
FIG. 17 is a timing diagram illustrating a pair of cooperative read transactions between two different ports.

FIG. 17 shows a pair of cooperative read transactions between two different ports. The first transaction is a simple two-byte column read, where the data is directed to appear on port B, rather than port A where the header was applied. The access time for this type of operation is similar to a normal column read access; it may be slightly longer or shorter depending on the overall path length between address input and data output. For this cooperative read transaction, the CLKIN input used to create the clock that brings the data out of the target port is the CLKIN input of the target port B (referred to as CLKIN_1), as opposed to the input port that supplies the header. FIG. 17 shows an arrow from the falling edge of CLKIN_0 on the input port A to the first CLKOUT_1 edge on the target port, and also an arrow from the first falling edge (in practice, this could be defined to be the first rising edge) of the CLKIN_1 input of the target port B. Once the header information has been entered into the decoding circuitry within the target cluster (using the propagation of the CLKIN_0 of the header input port), a flag is raised, and the first subsequent address clock edge (see FIG. 4) that arrives from the target port initiates the transaction. Subsequent to that point, the transaction functions as a normal burst transaction controlled by the target port.

The frequency of the data out burst on the target port is the CLKIN_1 frequency supplied to the target port. Different ports can operate at different frequencies and phases from each other. Further, the frequency of any one port can vary on a transaction by transaction basis, within the supportable electrical frequency range of the port. FIG. 17 shows two substantially different frequencies of operation for the two ports. Port A operates at a higher frequency than port B. The first transaction uses port A as the header port and port B as the target port. The output burst frequency is the frequency of CLKIN_1 of port B, the target port. The second transaction shown in FIG. 17 is a burst read in the opposite direction. The header is supplied on the lower frequency port B, but the output data arrives at the faster burst frequency supplied by CLKIN_0 on port A. Note that the only CLKIN edges that must be provided are those to transfer the header bytes into the header port, and enough CLKIN pulses on the target port to transfer the full burst of data out of the target port.

Figure 18:
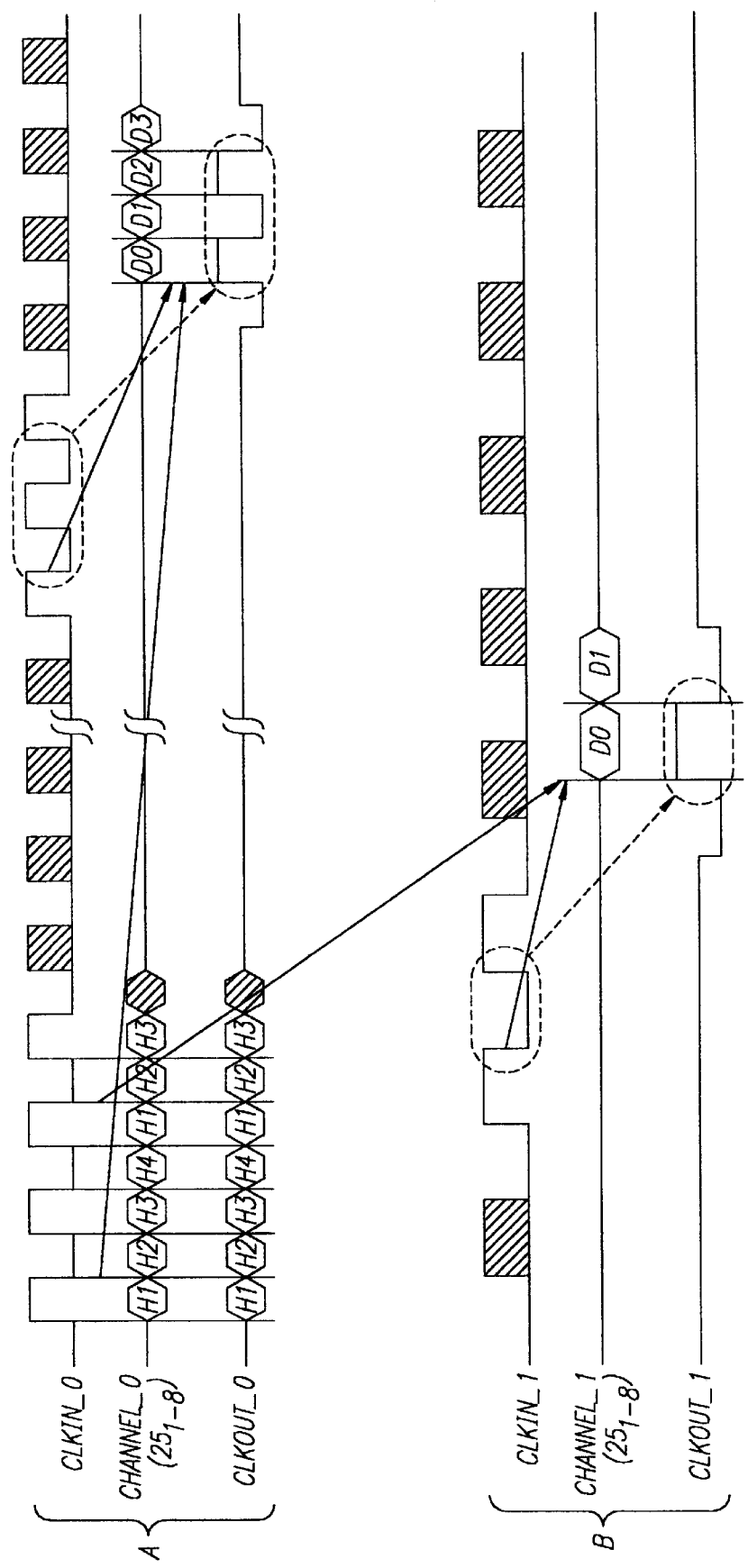
FIG. 18 is a timing diagram illustrating a cooperative column burst read transaction based on a header inserted immediately following the header of a previous row burst read access.

The present application allows the insertion of a second header immediately following a row read header or a background row activation header. FIG. 18 illustrates a cooperative column burst read transaction to a different bank that occurs from a header inserted immediately following the header of a row burst read access. The four-byte row burst read access that occurs on port A from the first applied header is completely normal, and is unaffected by the cooperative burst read transaction that is initiated by the second header on port A. The cooperative burst read transaction initiated by the second header operates in exactly the manner previously described for FIG. 17, in which the data is clocked out from port B by the CLKIN_1 signal applied to port B.

In the preferred embodiment, any type of read or background activation header may be inserted after a row read or activation header, except for a pipelined random column mode read header. Write transactions of any type require the data to be provided immediately following the header, and therefore should not be inserted in the middle of a row read transaction. A cooperative row read header for access to a different bank and port can be inserted in the same manner as the cooperative column read header for FIG. 18, and the subsequent procedure for the row access must occur on the target port in the same way as a normal row access to that port.

Another possibility for header insertion is shown in FIG. 19. It is possible to insert a row or column read header to the same bank following the header of a row burst read transaction. In that case, the information of the second header is placed in the next-up register for that bank, and will wait until the completion of the row read initiated by the first header before beginning execution. The read data for a column access from the second header can immediately follow the data for a row access from the first header, as shown in FIG. 19, while a subsequent row access from the second header will incur some additional latency due to the necessary precharge and row selection procedure. It is also possible to insert a read transaction into a different cluster, but with the same input header port being the target for both read transactions. If the inserted transaction is a column burst read, it would be processed first. When that transaction is complete, an internal flag is raised, and the previous row read transaction can be processed. Alternatively, if the inserted transaction is another row burst read transaction into a different cluster, then the previous row burst read transaction will proceed to completion before the internal flag is raised and the inserted transaction can be processed.

FIG. 20 illustrates the pipelined random column read mode made possible by the present application. In addition to the capability of supplying a new address every cycle from an on-chip column burst counter, it is possible with the pipelined structure of the present application to provide a new random column address from the master device on every cycle of the clock. This cannot be used to change a row in every cycle, due to the constraints of the row select circuitry and the memory cell architecture. But within a selected row, it is possible for the column select decoding circuitry to take each new address from the input bus rather than from the burst counter, and at the same frequency. This mode is entered by use of a unique two-word header, which indicates the entry into this special mode. This two-word header also contains the address of the target bank, the target port (for a read), and the number of cycles to be executed within this mode. The row must already have been selected within the target bank before entry into this mode, which may be accomplished with either a background row activation transaction, or a row read or write transaction that leaves the row enabled at the conclusion of the transaction.

This pipelined random column read mode is a type of cooperative transaction in the sense that the addresses are provided on one port while the data is output on a different port. This is necessary since more than a small number of consecutive addresses provided in this mode would conflict with data coming back on the same channel. In this mode, the clock frequency of the output data is matched to the clock frequency of the input addresses on the input port. This contrasts with the normal cooperative burst clocking scheme in which CLKOUT for the read data synchronization is derived from the CLKIN supplied to the target port. The maximum frequency for this type of operation is the smaller of the maximum possible frequency on either of the ports involved.

In the preferred implementation, the third and fourth words A0 and A1 (up to eighteen bits, including the CLKOUT pin) on the input port now become the first column address to be accessed. Data bytes D0 and D1 on the output port are the 16 bits accessed by the address provided on input words A0 and A1. Each subsequent pair of address words can access any column address contained within the selected row. There is no physical upper limit to the number of random column addresses that can be supplied to the same row in this mode (read or write), since the same address can be re-accessed at any time. The maximum frequency for the application of new addresses externally on the port is the same as from the burst counter, which is equal to the CLKIN frequency, but one-half the maximum data frequency at the external port. It is possible to provide nine-bit addresses at twice the frequency, but this requires either doubling most elements of the column decode circuitry (which can represent a significant space penalty), or reducing the CLKIN frequency from the maximum electrically possible, which may provide a small speed and granularity benefit in some cases.

Figure 21:
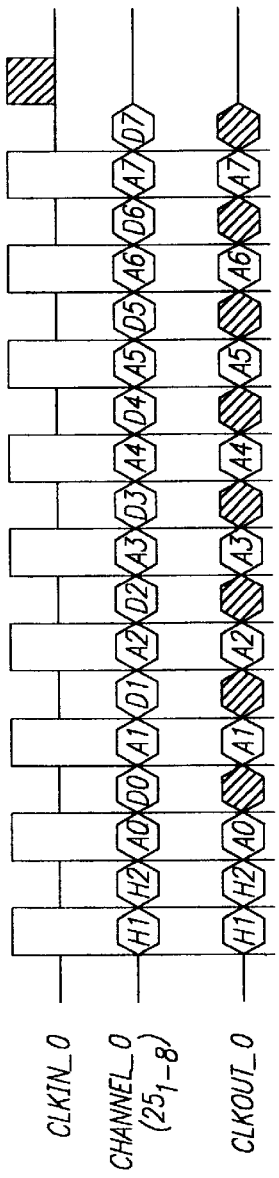
FIG. 21 is a timing diagram illustrating a pipelined random column write mode transaction with a single byte address alternating with a single byte of data on the same channel.
Figure 22:
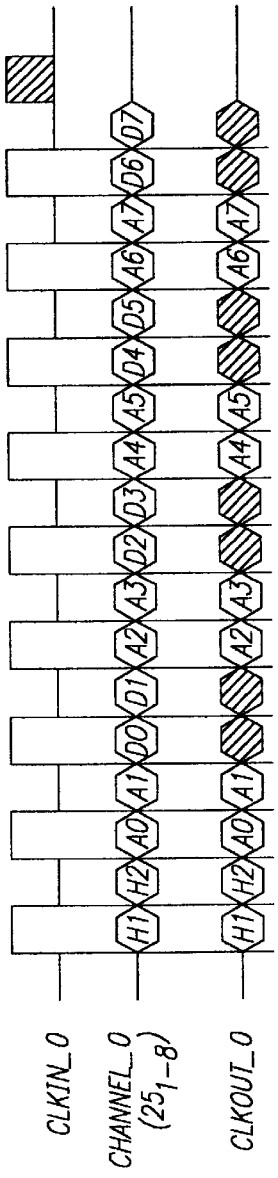
FIG. 22 is a timing diagram illustrating addresses and data provided in byte pairs on the same channel.
Figure 23:
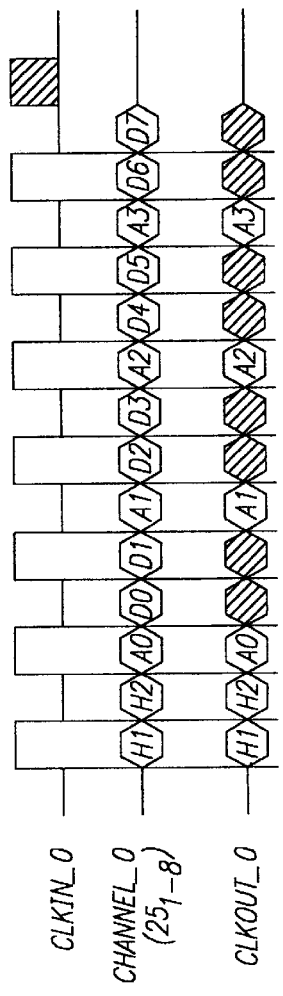
FIG. 23 is a timing diagram illustrating two bytes of write data for each single byte (nine bits) column address.

The write version of this pipelined random column mode has some significant differences from the read version. As in the burst write mode, the write data follows the address inputs immediately on the same channel for ease of synchronization. The three preferred implementations are shown in FIGS. 21, 22 and 23. It is possible to alternate single word addresses (nine bits, including CLKOUT) with single byte data on the same channel, as shown in FIG. 21. This has certain advantages for smaller column address spaces that require finer write granularity. An alternate implementation is shown in FIG. 22, in which addresses and data are provided in byte pairs on the same channel. This allows much larger column address spaces (which will be important as row sizes become larger in the future), and may fit many applications that write data in byte pairs. The maximum achievable data write bandwidth is the same in both cases, which is one-half the channel bandwidth, since one-half the bytes are used for address information, and one-half are used for data. The unused CLKOUT bit during transmission of the write bytes could be used for either an additional address bit or write bit in both cases. A third possibility is to provide two bytes of write data for each single word (nine bits) column address. This supports a 33% greater data bandwidth for smaller column access spaces (less than $2^9$ sixteen-bit addresses, or 1 k bytes), as shown in FIG. 23.

As noted above, the next-up register 56 of FIG. 7 permits a new transaction to be initiated before the current transaction is completed. For example, if a column burst read transaction is stored in the next-up register 56, and the current transaction is also a read transaction, then the same row is already accessed. As a result, the first internal column address of the stored column burst read transaction can follow immediately after the last internal address of the current transaction with the very next internal clock cycle. Thus, the new transaction begins several cycles before data from the current transaction appears on the output. Conversely, if the current transaction is a write transaction, an additional clock cycle may be inserted before beginning the stored read transaction in order to fully precharge the bit sense amplifier I/O lines after the current transaction is completed.

In contrast, within conventional DRAMs, the new external column address must wait until the data from the current transaction appears on the output. This results in a substantial delay equivalent to the time between internal address generation and data output time for the current transaction plus the time between the external address input to the internal address generation of the new transaction. This delay approximates the column access latency time of conventional DRAMs.

The capability of the next-up register 56 to permit a new transaction to be initiated before the current transaction is completed happens automatically without any stringent timing requirements on the external address and control signals. The new transaction column burst read header can be applied at any time after the initiation of the current transaction. In most cases, the new header will arrive on a different channel from the current transaction, because the current channel is busy with the read or write data of the current transaction. If the current transaction is a row burst read transaction, however, it is permissible to provide one additional header on the same channel immediately after the row burst header. The header insertion capability for row read transactions has been described in greater detail above.

If the new transaction stored in the next-up register 56 is a row burst read transaction, the present architecture provides a large latency savings. The new row burst read header can be supplied at any time after the beginning of the current transaction. The precharge of the bitlines will occur immediately after completion of the current read or write transaction, as long as either the new row transaction is provided to the next-up register in time, or the current transaction includes the precharge option in the header. Once the precharge option begins, it is acceptable to allow the row address of the new transaction to propagate through the row predecoder 38 to the row decoder 41. From that point, the row decoder 41 waits for a signal indicating that the precharge operation is complete, at which time the row line can be immediately enabled. This procedure saves the entire delay from the chip inputs to the row decoder address inputs, which can be as much as 10–20 ns using current DRAM technology. Conventional DRAMs do not permit parallel row decoding simultaneously with bitline precharging.

MULTI-DIRECTIONAL SMALL SIGNAL REPEATER

Figure 26:
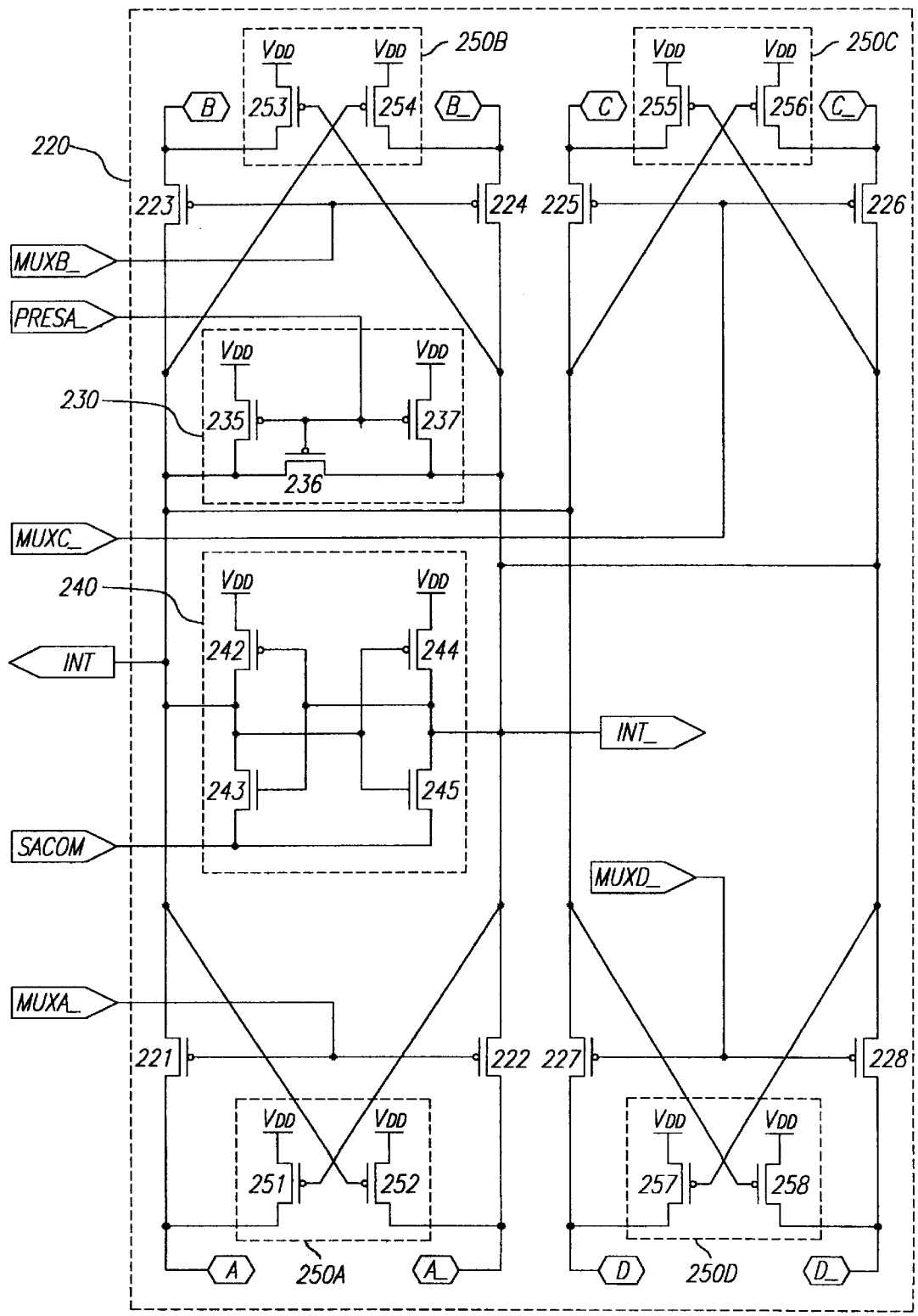
FIG. 26 is a schematic drawing of a multidirectional signal transfer circuit of the present invention.

Turning now to FIG. 26, a multidirectional signal transfer circuit 220 of the present invention is illustrated in schematic form. A plurality of differential signal transfer terminal pairs are provided and designated with reference letters: A, A__; B, B__; C, C__ and D, D__. As will be apparent from the description that follows, each of the differential signal transfer terminal pairs are capable of sending and receiving a differential signal to at least one other differential signal transfer terminal pair. A greater or lesser number of differential signal transfer terminal pairs are also possible, with four such terminal pairs illustrated merely for simplicity.

In the present invention, the differential signal is defined with a bias voltage level at $V_{DD}$, such as on the order of 300 millivolts relative to a 3.3 volt CMOS $V_{DD}$ full rail voltage level, with a first data state being represented by a first polarity differential and a second data state being represented by an opposite polarity differential. For example, a data signal having a first data state applied to the terminals A, A__ would comprise a 3.3 volt $V_{DD}$ full rail voltage level applied to terminal A and a 3.0 volt level applied to terminal A__, with a positive differential between the terminals of 300 millivolts. Conversely, a data signal having a second data state would comprise a 3.3 volt $V_{DD}$ full rail voltage level applied to terminal A__ and a 3.0 volt level applied to terminal A. It should be apparent that alternative differential values and bias voltage levels are also possible, and further that the bias voltage can be at $V_{SS}$ as opposed to $V_{DD}$, with complete reversal of device types and signal polarities of the transistors of the signal transfer circuit 220.

The respective terminals of the differential signal terminal pairs are each coupled to an associated isolation device. More particularly, transfer terminal A is coupled to isolation device 221 and transfer terminal A__ is coupled to isolation device 222; terminals B, B__ are coupled to isolation devices 223, 224, respectively; terminals C, C__ are coupled to isolation devices 225, 226, respectively; and, terminals D, D__ are coupled to isolation devices 227, 228, respectively. Each individual isolation device 221–228 comprises a p-channel FET device functioning as an isolation gate between the associated transfer terminal and one of a pair of internal nodes INT, INT__, with the drains of each respective isolation device coupled to an associated one of the transfer terminals and the sources of each respective isolation device coupled to a respective one of the internal nodes.

The gates of respective pairs of the isolation devices 221–228 are coupled together and also to a control signal input terminal for controlling the state of the paired devices. More specifically, isolation device pairs 221, 222 are adapted to receive a control signal termed MUXA__. Similarly, paired isolation devices 223, 224 are adapted to receive control signal MUXB__; isolation devices 225, 226 are adapted to receive control signal MUXC__; and, isolation devices 227, 228 are adapted to receive control signal MUXD__. As known in the art, the control signals MUXA__, MUXB__, MUXC__ and MUXD__ are provided by an external control circuit.

An internal precharge circuit 230 comprising three p-channel FET devices 235–237 is coupled between the internal nodes INT, INT__ and to device supply voltage $V_{DD}$. Each of the devices 235–237 has a commonly coupled gate that is adapted to receive a precharge control signal termed PRESA__. The sources of the devices 235 and 237 are commonly coupled to $V_{DD}$. The drains of the devices 235 and 237 are each coupled to a respective one of the internal nodes INT, INT__, and also to one of the source and drain of the device 236.

A cross-coupled differential amplifier circuit 240 comprising p-channel devices 242, 244, and n-channel devices 243, 245 is also coupled between the internal nodes INT, INT__. The sources of the devices 242, 244 are commonly coupled to $V_{DD}$. The drain of the device 242 is coupled to the internal node INT, to the commonly coupled gates of the devices 244, 245, and to the drain of the device 243. Similarly, the drain of the device 244 is coupled to the internal node INT__, to the commonly coupled gates of the devices 242, 243, and to the drain of the device 245. The sources of the devices 243, 245 are commonly coupled together and adapted to receive an amplifier control signal termed SACOM.

Figure 27:
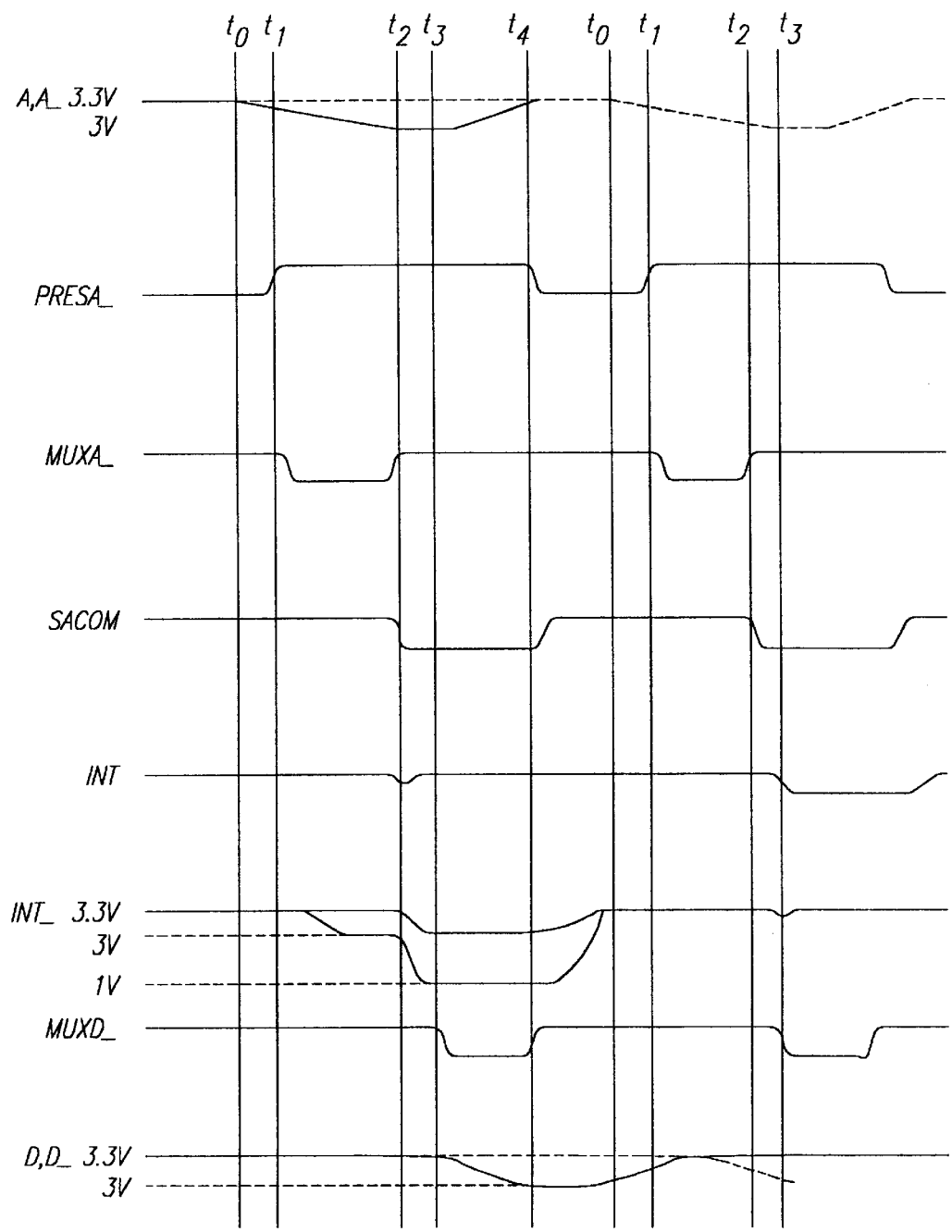
FIG. 27 is a timing diagram illustrating signals used to control an individual multidirectional signal transfer circuit.

Operation of the multidirectional signal transfer circuit 220 of FIG. 26 will now be described with reference to the timing diagram of FIG. 27. Before time to, the internal nodes INT, INT__ and transfer terminals A, A__ through D, D__ are precharged and equalized at the device voltage level $V_{DD}$. The internal nodes INT, INT__ are precharged by application of the PRESA__ control signal. The PRESA__ control signal is at a low value (i.e, $V_{SS}$) that causes each of the p-channel devices 235–237 to conduct, coupling the internal nodes INT and INT__ to $V_{DD}$ through the devices 235 and 237, respectively. The device 236 serves to equalize the voltage level on each of the internal nodes INT and INT__. The precharging of the transfer terminals A, A__ through D, D__ will be described in greater detail below.

Initially, all of the isolation devices 221–228 are disabled (i.e., in a non-conducting state) to isolate the transfer terminals from the internal nodes INT, INT__, and the multidirectional signal transfer circuit 220 is ready to transmit a signal between two or more of the signal transfer terminals. For exemplary purposes, a differential signal transferred between transfer terminals A, A__ and D, D__ will be described, though it should be apparent that a signal can also be transferred between any of the other transfer terminals by the same process, such as from D, D__ to A, A__.

At time to, a differential input signal arrives at the transfer terminals A, A__, which causes the voltage at one of the transfer terminals A or A__ (depending on the data state of the differential signal present on the transfer terminal pair) to begin to drop from $V_{DD}$. For purposes of this explanation, the voltage at the transfer terminal A__ drops relative to $V_{DD}$, representing a first data state or a "1" (in contrast to a "0" obtained by a voltage drop at the transfer terminal A). As illustrated in FIG. 27, the voltage at terminal A__ begins to drop from $V_{DD}$ to a voltage level below $V_{DD}$.

At time $t_1$, the internal node precharge circuit 230 is turned off by disabling the PRESA__ control signal, returning devices 235–237 to a non-conductive state. At approximately the same time, or slightly afterward, the isolation devices 221, 222 are enabled by the application of a negative voltage on the MUXA__ control signal. This allows the differential signal on the transfer terminals A, A__ to propagate into the internal nodes INT, INT__, causing the voltage at the internal node INT__associated with the transfer terminal A__ to similarly drop from $V_{DD}$. Since there is very little capacitive load on the internal nodes INT, INT __, relative to the capacitance on the single transfer terminals A, A__, the drop in voltage is particularly abrupt.

Ideally, the timing of $t_1$, should occur simultaneously with the timing of $t_0$. If the isolation devices 221, 222 are enabled early (before time $t_0$), there will be no differential signal at the transfer terminal, and the internal nodes INT, INT__ will not be affected. This does not create a problem for the multidirectional signal transfer circuit 220, but in practice it may be difficult to generate the timing signals in this sequence. Conversely, there may be no time delay penalty associated with late enabling of the isolation devices 221, 222 because the internal nodes INT, INT__ will quickly charge share with the transfer terminals A, A__ when the isolation devices are enabled. As a result, the final voltage levels at the internal nodes INT, INT __ necessary for reliable voltage sensing can be reached in the same amount of time whether the isolation devices are enabled precisely at time $t_0$, or slightly before or after time $t_0$.

At time $t_2$, after a delay determined by the minimum time required for the differential signal between the internal nodes INT, INT__ to reach the desired differential value (one to two nanoseconds for a three hundred millivolt transition with a one picofared line capacitance, depending on the current output of the previous stage), the differential signal amplifier circuit 240 is enabled by a negative transition of the SACOM control signal to a low value (i.e., $V_{SS}$). The minimum desired differential value between the internal nodes INT, INT__ at time $t_2$ is determined by the need to overcome device mismatches as well as internal noise of the integrated circuit during operation. Since the internal nodes INT, INT__ were precharged to $V_{DD}$, both of the n-channel devices 243, 245 are quickly driven to a conductive state at the time the SACOM control signal is applied, due to the small differential voltage at INT, INT__ and the fast fall time of the SACOM control signal. Application of the SACOM control signal starts pulling both INT and INT__ toward $V_{SS}$ through the n-channel devices 243, 245. The lower beginning voltage level at the internal node INT__ relative to INT causes the voltage at INT__ to continue to drop faster than the voltage at INT, further causing the p-channel device 242 to become conductive and the n-channel device 243 to start shutting off. This causes the voltage at the internal node INT to rise quickly back toward $V_{DD}$, keeping the p-channel device 244 non-conductive and reinforcing the rate at which the voltage at the internal node INT__ is pulled low. As a result, the differential signal between the transfer terminals A, A__ becomes amplified and latched onto the internal nodes INT, INT__.

At approximately the same time, before the voltage level on the internal node INT__ has fallen more than approximately 30% of the full $V_{DD}$ value (between 800 millivolts and 1 volt below $V_{DD}$), the isolation devices 221, 222 are turned off by disabling the MUXA__ control signal. The rate at which the voltage level on the internal node INT__ drops is increased by the isolation of the internal nodes INT, INT__ from the terminals A, A__ by the turning off of the isolation devices 221, 222. Therefore, MUXA__ can be deselected even before SACOM begins to fall, with the only drawback being the possible incomplete sampling of the full differential signal on A, A__. Shortly thereafter, at time $t_3$, the isolation devices 227, 228 at transfer terminals D, D__ are turned on by application of the MUXD__ control signal. The delay time between application of the SACOM control signal at time $t_2$ and the MUXD__ control signal at time $t_3$ permits a relatively large differential voltage to develop at the internal nodes INT, INT__ without being affected by charge sharing with the transfer terminals D, D__.

The drop of the voltage level on the internal node INT__ is then simultaneously arrested and reversed slightly by charge sharing between the internal node INT__ and the precharged terminal D__ as the isolation devices 227, 228 are enabled by application of the MUXD__ control signal. The relatively large differential voltage at the internal nodes INT, INT__ quickly transitions to a small differential voltage (300–500 millivolts) at the terminals D, D__, since the capacitance on the terminals D, D__ is much greater than the capacitance of the internal nodes INT, INT__. The differential voltage on terminals D, D__ would be sufficient for sensing by a follow-on circuit, such as another multidirectional signal transfer circuit 220.

Finally, at time $t_4$, the isolation devices 227, 228 are turned off by disabling the MUXD__ control signal. A sufficient differential signal has now completed its transfer to the D, D__ transfer terminals, and the internal nodes INT, INT__ are again isolated from the D, D__ transfer terminals. The multidirectional signal transfer circuit 220 then readies itself to begin the transfer process again by precharging the internal nodes INT, INT__ to device voltage level $V_{DD}$ by application of the PRESA__ control signal. The SACOM control signal is also raised to the device voltage level $V_{DD}$ to turn off the differential signal amplifier circuit 240 and allow maximum precharging and equalizing of the internal nodes INT, INT__. Alternatively, the SACOM control signal may be raised to a voltage level below $V_{DD}$, such as $V_{DD}-V_T$ where $V_T$ is the threshold of the devices being used, at which the internal nodes INT, INT__ would equalize at the device voltage level $V_{DD}$ without current flowing in the n-channel devices 243 and 245.

The signal transfer circuit 220 is also capable of transferring a differential input signal to a plurality of transfer terminals simultaneously. In the above description, a differential signal can be transferred from the A, A__ transfer terminals to both the D, D__ terminals and the C, C__ terminals by applying the MUXC__ control signal to the isolation devices 225, 226 at time $t_3$, the same time that the MUXD__ control signal is applied to the isolation devices 227, 228. At time $t_4$, the isolation devices 225, 226 are turned off by disabling the MUXC__ control signal at the same time that the isolation devices 227, 228 are turned off by disabling the MUXD__ control signal. It should be apparent that the signal transfer circuit 220 can transfer the differential signal to any number of the transfer terminals in a similar manner. In the case of two or more transfer terminals being utilized as an output at the same time, the fixed amount of current that can be supplied by the differential amplifier circuit 240 will be shared by the enabled terminals. Thus, the amount of time between time $t_3$ and $t_4$ may be increased for the differential amplifier circuit 240 to drive the multiple output terminals. Alternatively, the differential amplifier circuit 240 may be constructed with larger than normal device sizes capable of providing higher output current levels.

The multidirectional signal transfer circuit 220 of FIG. 26 further comprises a plurality of gain enhancing circuits 250_A_, 250_B_, 250_C_, and 250_D_ coupled to respective ones of the transfer terminals (illustrated in conjunction with transfer terminals A, A__ through D, D__, respectively). More particularly, p-channel devices 251, 252 are cross-coupled to the transfer terminals A, A__; p-channel devices 253, 254 are cross-coupled to the transfer terminals B, B__; p-channel devices 255, 256 are cross-coupled to the transfer terminals C, C__; and, p-channel devices 257, 258 are cross-coupled to the transfer terminals D, D__. The devices 251, 252 have sources that are commonly coupled to $V_{DD}$. The device 251 has its drain coupled to A, and its gate coupled to INT__. Conversely, the device 252 has its drain coupled to A__, and its gate coupled to INT. Each of the other devices 253–258 of the gain enhancing circuits 250_B_–250_D_ are coupled to the respective transfer terminals in a like manner.

The gain enhancing circuits 250 operate during the time that the differential signal amplifier circuit 240 is operating. The gain enhancing circuits 250 are necessary to minimize undesired voltage droop of the high-remaining output transfer terminal (in the above example, transfer terminal D) which should ideally remain at $V_{DD}$. Ideally, the low side output transfer terminal (D__) will slew as quickly as possible while the high side output transfer terminal (D) remains solid at $V_{DD}$. In practice, however, the voltage at the high side internal node unavoidably droops slightly before pulling back to $V_{DD}$. In order to minimize the transfer of this unwanted droop from the internal node to the output transfer terminal, the most effective drain connections for the gain enhancing p-channel devices 257, 258 is directly to the output transfer terminals D, D__. It should be apparent to those skilled in the art that this connection on all of the transfer terminals will have the most positive effect on the output transfer terminals, while causing no adverse effects on the input transfer terminals (A, A__) and the unused transfer terminals (B, B__, C, C__).

While an input signal is typically transferred through the multidirectional signal transfer circuit 220 from one pair of transfer terminals to one or more other pairs of transfer terminals, the input signal could merely return to the original pair of transfer terminals for use as a local amplifier. For example, a small differential signal sensed at the A, A__ transfer terminals could be permitted to propagate through the isolation devices 221, 222 to the internal nodes INT, INT__ for amplification by the differential signal amplifier circuit 240, without disabling the isolation devices 221, 222. The multidirectional signal transfer circuit 220 would then merely amplify or reinforce the differential signal on the transfer terminals A, A__, or could be used to modify the level of the differential signal. The isolation devices 221, 222 would be disabled only after a desired differential voltage is achieved and propagated through the isolation devices.

In alternative embodiments of the present invention, the repeater circuit can be configured to operate as a small signal receiver or transmitter. A small signal receiver receives a differential voltage input signal and generates a full rail voltage representative signal. Small signal receivers of this type are useful, for example, at the final stage of a series of repeaters. At some point, the small signal must be converted to a large voltage swing. In a data read operation, the small signal of a DRAM memory cell that is transmitted by successive repeater stages must ultimately be converted to a full rail voltage output signal.

A small signal transmitter is the inverse of a small signal receiver, and receives a full rail voltage input signal and generates a differential voltage output. These would be used at the beginning of the successive repeater stages. In a data write operation, a full rail voltage input signal is converted to a high speed small signal differential signal for long distance transfer across the integrated circuit chip at minimum power expenditure. In such a case, there would be small signal repeater stages, with a final receiver stage to convert the small signal back to full rail signals.

Having thus described a preferred embodiment of an independent and cooperative multichannel memory architecture, it should be apparent to those skilled in the art that certain advantages of the present system have been achieved. It should also be appreciated that various modifications, adaptations, and alternative embodiments thereof may be made within the scope and spirit of the present invention. The invention is further defined by the following claims.

What is claimed is:

1. A multichannel memory architecture comprising:
   at least two independent memory clusters, each of said clusters having a plurality of individually addressable data storage locations with each of said data storage locations having distinct column and row addresses; and
   at least two multi-line channels, each channel including bus lines, each channel respectively coupling at least one of at least two logic units to at least one of said clusters, each logic unit being capable of controlling a memory transaction, each channel being adapted to carry address and control information and data information for conducting said memory transaction between said at least one of said logic units and said at least one of said clusters, said at least two multi-line channels providing a plurality of distinct operating modes for said memory transaction, and at least one of said multi-line channels being adapted to carry at least part of said address and control information and at least part of said data information over at least one common bus line.

2. The multichannel memory architecture of claim 1, wherein each of said plurality of clusters further comprise at least one independently addressable memory bank.

3. The multichannel memory architecture of claim 1, further comprising a plurality of master devices coupled to said multi-line channels for conducting selected data read and/or write transactions within said at least one of said clusters.

4. The multichannel memory architecture of claim 1, further comprising at least one multiplexer coupled to at least two of said at least two multi-line channels between said master device and at least one of said clusters.

5. The multichannel memory architecture of claim 1, further comprising clock input and output ports associated with each of said multi-line channels.

6. The multichannel memory architecture of claim 1, wherein a first one of said at least two logic units is coupled to at least one of said multi-line channels and to a second one of said at least two logic units.

7. The multichannel memory architecture of claim 1, wherein one of said multi-line channels provides a dedicated coupling into one of said independent memory clusters.

8. The multichannel memory architecture of claim 1, wherein each transaction has a clock signal propagating with it.

9. The multichannel memory architecture of claim 1, wherein at least one of the memory clusters comprises a refresh counter for background refresh operations of the memory cluster.

10. A multichannel memory architecture comprising:
    a memory device having a plurality of independent clusters, each of said clusters having at least one independently addressable memory bank containing a plurality of individually addressable data storage locations with each of said data storage locations having distinct column and row addresses; and
    a plurality of multi-line channels, each channel including bus lines, each channel respectively coupling at least one of at least two logic units to at least two of said clusters, each logic unit being capable of controlling a memory transaction, each channel being adapted to carry address and control information and data information for conducting said memory transaction between said at least one of said logic units and said at least two of said clusters, said plurality of multi-line channels providing a plurality of distinct operating modes for said memory transactions, and at least one of said multi-line channels being adapted to carry at least part of said address and control information and at least part of said data information over at least one common bus line.

11. The multichannel memory architecture of claim 10, wherein said memory device further comprises at least eight of said clusters.

12. The multichannel memory architecture of claim 10, wherein said plurality of multi-line channels further comprises at least four multi-line channels.

13. The multichannel memory architecture of claim 10, wherein particular ones of said plurality of independent memory clusters comprise a plurality of banks.

14. The multichannel memory architecture of claim 10, wherein said master device further comprises a plurality of bi-directional communication ports with each one of said ports coupled to respective ones of said plurality of multi-line channels.

15. The multichannel memory architecture of claim 10, wherein said memory device further comprises a plurality of bi-directional communication ports with each one of said ports coupled to respective ones of said plurality of multi-line channels.

16. The multichannel memory architecture of claim 15, wherein said memory device further comprises at least one multiplexer coupled to at least two of said communication ports and a portion of said plurality of clusters.

17. The multichannel memory architecture of claim 10, wherein each said cluster further comprises means for controlling addressing of associated memory banks within said cluster responsive to said address information provided on one of said multi-line channels.

18. The multichannel memory architecture of claim 10, further comprising means for synchronizing said carrying of data and address information on each of said multi-line channels.

19. The multichannel memory architecture of claim 18, further comprising means for providing a clock signal, and wherein said synchronizing means further comprises a clock signal delay unit that provides a delay to said clock signal so that said clock signal follows behind said data and address information on each of said multi-line channels.

20. The multichannel memory architecture of claim 19, wherein said synchronizing means comprises a data buffer coupled to the master device for converting a voltage level of the data and of the address information and a clock buffer coupled to the clock signal delay unit for converting a voltage level of the clock.

21. The multichannel memory architecture of claim 20, wherein the data buffer and the clock buffer are substantially identical.

22. The multichannel memory architecture of claim 10, wherein one of said multi-line channels provides a dedicated coupling into one of said banks.

23. The multichannel memory architecture of claim 10, wherein at least one of said memory clusters comprises a next-up register for permitting a new transaction to begin before a current transaction is complete.

24. A multichannel memory architecture comprising:

a memory device having a plurality of independently addressable memory banks each having a plurality of individually addressable data storage locations with each of said data storage locations having distinct column and row addresses;

a plurality of multi-line channels, each channel including bus lines, each channel respectively coupling at least one of at least two logic units to at least two of said memory banks, each logic unit being capable of controlling a memory transaction, each channel being adapted to transfer data, address and control information between said at least one of said logic units and said at least two of said memory banks; and means for synchronizing said transfers of data, address and control information on each of said multi-line channels, at least one of said multi-line channels being adapted to carry at least part of said address and control information and at least part of said data information over at least one common bus line;

wherein said plurality of multi-line channels provide a plurality of distinct operating modes for said memory transaction.

25. The multichannel memory architecture of claim 24, further comprising means for providing a clock signal, said synchronizing means further providing a time delay to said clock signal so that said clock signal lags behind said data, address and control information on each of said multi-line channels.

26. A multichannel memory architecture comprising:

a memory device having a plurality of independently addressable memory banks each having a plurality of individually addressable data storage locations with each of said data storage locations having distinct column and row addresses;

a plurality of multi-line channels, each channel including bus lines, each channel respectively coupling at least one of at least two logic units to at least two of said memory banks, each logic unit being capable of controlling a memory transaction, each channel being adapted to transfer data, address and control information between said at least one of said logic units and said at least two of said memory banks; and means for conducting said memory transaction between said at least one logic unit and respective ones of said plurality of banks, at least one of said multi-line channels being adapted to carry at least part of said address and control information and at least part of said data information over at least one common bus line;

wherein said plurality of multi-line channels provide a plurality of distinct operating modes for said memory transaction.

27. The multichannel memory architecture of claim 26, wherein said conducting means further comprises a header protocol that defines each of said transactions.

28. The multichannel memory architecture of claim 27, wherein said header protocol comprises a plurality of multi-bit words, each of said words defining particular attributes of said transactions.

29. A multichannel memory architecture comprising:

at least two independent memory clusters, each of said clusters having a plurality of individually addressable data storage locations with each of said data storage locations having distinct column and row addresses; and at least two multi-line channels, each channel including bus lines, each channel respectively coupling at least one of two logic units to at least one of said clusters, each logic unit being capable of controlling a memory transaction, each channel being adapted to carry address and control information and data information for conducting said memory transaction between the at least one logic unit and said at least one of said clusters, said at least two channels providing a plurality of distinct operating modes for said memory transaction, and at least one of said multi-line channels being adapted to carry at least part of said address and control information and at least part of said data information over at least one common bus line.

30. The multichannel memory architecture of claim 29, wherein at least two memory clusters each include a central bank control logic unit.

31. A multichannel memory architecture comprising:

at least two independent memory clusters, each cluster having individually addressable data storage locations with each data storage location having distinct column and row addresses;

at least one logic unit capable of providing memory cluster interface, protocol generation and scheduling; and at least two multi-line channels, each channel respectively coupling the at least one logic unit to at least one of the clusters, each channel being adapted to carry address and control information and data information for conducting selected memory transactions between the at least one logic unit and the at least one of the clusters, the at least one logic unit providing the scheduling for selectively routing memory transactions to the at least two multi-line channels, the at least two multi-line channels providing a plurality of distinct operating modes for the memory transactions, the distinct operating modes including independent, cooperative and synchronous modes.

* * * * *